(12) United States Patent
Glass et al.

(10) Patent No.: US 11,121,030 B2
(45) Date of Patent: Sep. 14, 2021

(54) TRANSISTORS EMPLOYING CARBON-BASED ETCH STOP LAYER FOR PRESERVING SOURCE/DRAIN MATERIAL DURING CONTACT TRENCH ETCH

(71) Applicant: INTEL CORPORATION, Santa Clara, CA (US)

(72) Inventors: Glenn A. Glass, Portland, OR (US); Anand S. Murthy, Portland, OR (US); Karthik Jambunathan, Hillsboro, OR (US); Benjamin Chu-Kung, Portland, OR (US); Seung Hoon Sung, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,960

(22) PCT Filed: Mar. 30, 2017

(86) PCT No.: PCT/US2017/025017
§ 371 (c)(1),
(2) Date: Jun. 26, 2019

(87) PCT Pub. No.: WO2018/182618
PCT Pub. Date: Oct. 4, 2018

(65) Prior Publication Data
US 2019/0341300 A1    Nov. 7, 2019

(51) Int. Cl.
*H01L 21/768* (2006.01)
*H01L 29/06* (2006.01)
(Continued)

(52) U.S. Cl.
CPC .. *H01L 21/76831* (2013.01); *H01L 21/76816* (2013.01); *H01L 21/76877* (2013.01);
(Continued)

(58) Field of Classification Search
CPC ............... H01L 29/785; H01L 29/7851; H01L 29/66795; H01L 29/0669; H01L 29/0673;
(Continued)

(56) References Cited

U.S. PATENT DOCUMENTS

2013/0011984 A1   1/2013   Wang et al.
2013/0341722 A1   12/2013  Illgen et al.
(Continued)

FOREIGN PATENT DOCUMENTS

WO   2015199655 A1   12/2015
WO   2018182618 A1   10/2018

OTHER PUBLICATIONS

International Search Report and Written Opinion received for PCT/US2017/025017, dated Dec. 22, 2017. 13 pages.
(Continued)

*Primary Examiner* — Thanhha S Pham
(74) *Attorney, Agent, or Firm* — Schwabe, Williamson & Wyatt, P.C.

(57) ABSTRACT

Techniques are disclosed for forming transistors employing a carbon-based etch stop layer (ESL) for preserving source and drain (S/D) material during contact trench etch processing. As can be understood based on this disclosure, carbon-based layers can provide increased resistance for etch processing, such that employing a carbon-based ESL on S/D material can preserve that S/D material during contact trench etch processing. This is due to carbon-based layers being able to provide more robust (e.g., more selective) etch selectivity during contact trench etch processing than the S/D material it is preserving (e.g., Si, SiGe, Ge, group III-V
(Continued)

semiconductor material) and other etch stop layers (e.g., insulator material-based etch stop layers). Employing a carbon-based ESL enables a given S/D region to protrude from shallow trench isolation (STI) material prior to contact metal deposition, thereby providing more surface area for making contact to the given S/D region, which improves transistor performance.

19 Claims, 9 Drawing Sheets

(51) Int. Cl.
    *H01L 29/08*      (2006.01)
    *H01L 29/417*      (2006.01)
    *H01L 29/66*      (2006.01)
    *H01L 29/78*      (2006.01)
    *H01L 29/423*      (2006.01)
    *H01L 29/49*      (2006.01)

(52) U.S. Cl.
    CPC ...... *H01L 29/0669* (2013.01); *H01L 29/0847* (2013.01); *H01L 29/417* (2013.01); *H01L 29/4232* (2013.01); *H01L 29/49* (2013.01); *H01L 29/6659* (2013.01); *H01L 29/66545* (2013.01); *H01L 29/785* (2013.01)

(58) Field of Classification Search
CPC ........... H01L 21/76829; H01L 29/0847; H01L 29/41791; H01L 29/41725
See application file for complete search history.

(56) References Cited

U.S. PATENT DOCUMENTS

| | | | |
|---|---|---|---|
| 2015/0069473 A1 | 3/2015 | Glass et al. | |
| 2016/0049482 A1* | 2/2016 | Liu | H01L 21/283 257/288 |
| 2016/0056232 A1 | 2/2016 | Kuo et al. | |
| 2016/0204026 A1 | 7/2016 | Liu et al. | |
| 2017/0047325 A1* | 2/2017 | Mehta | H01L 29/45 |

OTHER PUBLICATIONS

International Preliminary Report on Patentability received for PCT/US2017/025017, dated Oct. 10, 2019. 10 pages.

\* cited by examiner

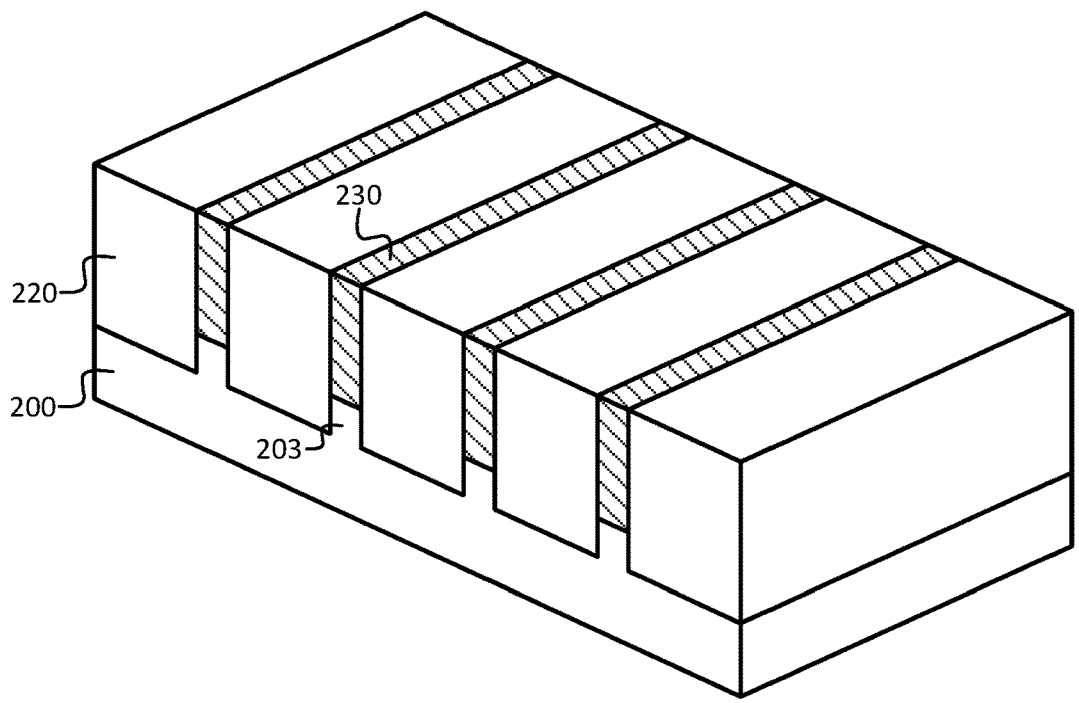
FIG. 2E
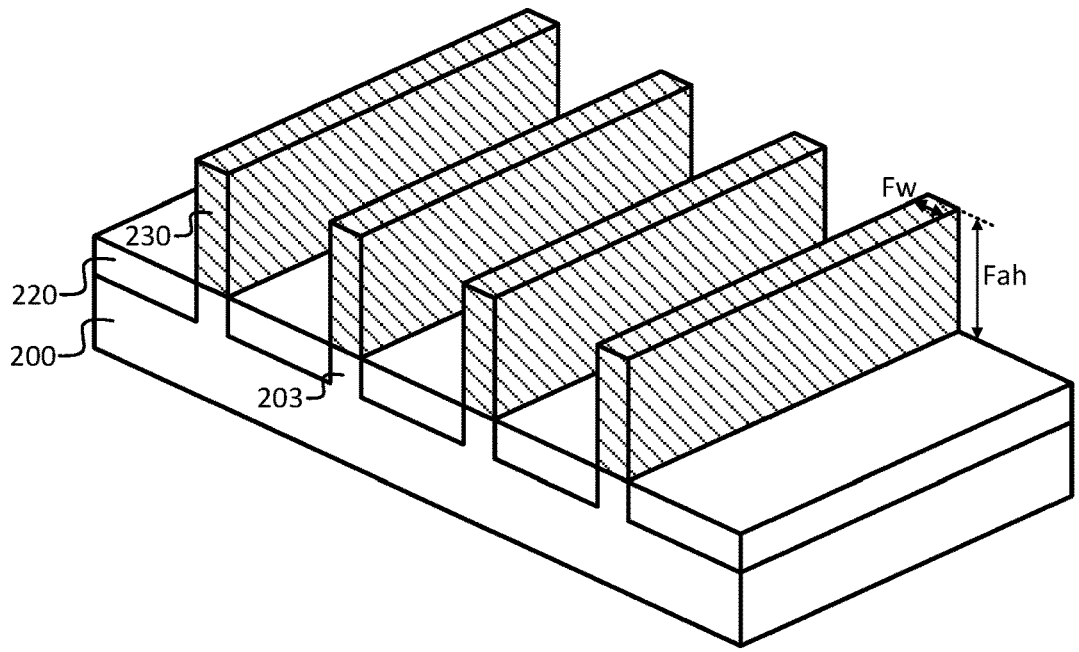
FIG. 2F
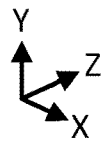

TRANSISTORS EMPLOYING CARBON-BASED ETCH STOP LAYER FOR PRESERVING SOURCE/DRAIN MATERIAL DURING CONTACT TRENCH ETCH

CROSS-REFERENCE TO RELATED APPLICATIONS

This patent application is a U.S. National Phase Application under 35 U.S.C. Ø 371 of International Application No. PCT/US2017/025017, filed on Mar. 30, 2017, the entire contents of which is hereby incorporated by reference herein.

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-L illustrate example IC structures that are formed when carrying out the method of FIG. 1, in accordance with some embodiments.

FIG. 2H' is a blown-out portion of FIG. 2H, illustrating an alternative rounded S/D region that may be formed, in accordance with some embodiments.

FIG. 2H" is a blown-out portion of FIG. 2H, illustrating that a final S/D region can alternatively be formed by depositing one or more cladding layers on a replacement fin of FIG. 2G, in accordance with some embodiments.

FIGS. 2K'-K''' are blown-out portions of FIG. 2K, illustrating variations that may occur as the source and drain contact processing of the method of FIG. 1 is performed, in accordance with some embodiments.

FIG. 2L' is a blown-out portion of FIG. 2L, illustrating an example contact formed in the example contact trench from FIG. 2K', in accordance with some embodiments.

FIG. 3' illustrates the cross-sectional view of FIG. 3, including the variation illustrated by FIG. 2K" where a portion of the carbon-based ESL remains on the S/D regions, in accordance with some embodiments.

Figure 1:
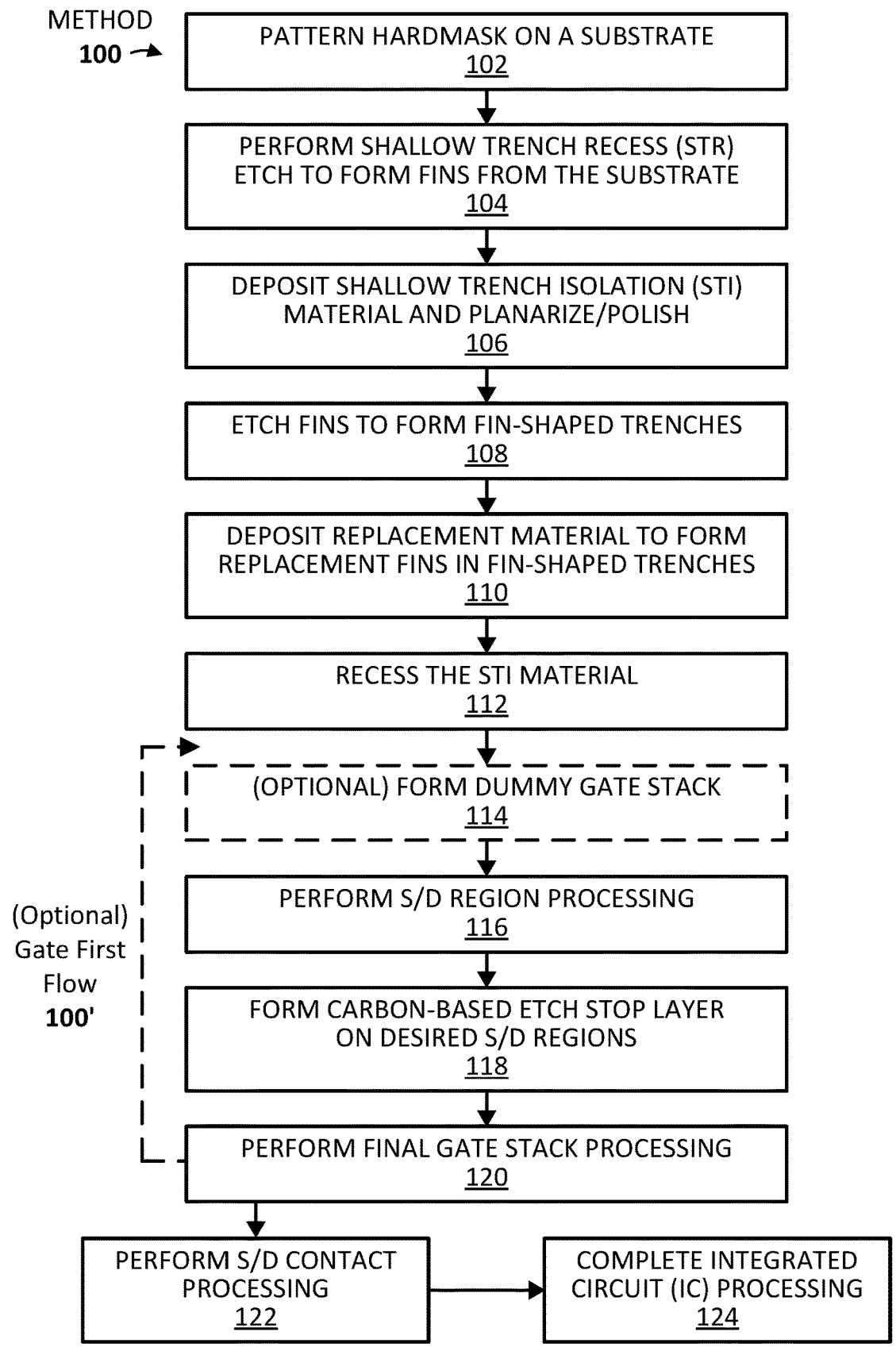
FIG. 1 illustrates a method of forming an integrated circuit (IC) including one or more transistors employing a carbon-based etch stop layer (ESL) for preserving source and drain material during contact trench etch processing, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

A major device performance limiter for transistor external resistance (e.g., for MOSFET devices) is the ability to scale the area of semiconductor to metal contact in source and drain (S/D) regions. Current contact etches have poor selectivity when etching through insulator materials and needing to stop the etch on the S/D semiconductor material, such as doped silicon (Si), silicon germanium (SiGe), or germanium (Ge). The result is that the S/D contact trench etch consumes significant amounts of the S/D semiconductor material and also fails to reveal the sides of the S/D material (in the case of non-planar transistor configurations) to enable high contact area. This is an issue because external resistance at the S/D locations scales linearly with contact area, such that a decrease in contact area leads to a proportional increase in resistance, thereby degrading performance. Such an issue is exacerbated when monolithically co-integrating diverse S/D regions using a common substrate (e.g., where the diverse S/D regions may have different heights, different shapes, compositionally different semiconductor materials, etc.), because the trench etch processing performed to make contact to those diverse S/D regions has to account for the diversity involved. The issue is further exacerbated as transistor devices are scaled down to include smaller and smaller critical dimensions, such as transistor devices including lateral gate lengths (between corresponding S/D regions) that are sub-50 nm, for example.

Thus, and in accordance with numerous embodiments of the present disclosure, techniques are provided for forming transistors employing a carbon-based etch stop layer (ESL) for preserving source and drain (S/D) material during contact trench etch processing. As can be understood based on this disclosure, carbon-based layers can provide increased resistance for etch processing, such that employing a carbon-based ESL on S/D material can preserve and/or protect that S/D material during contact trench etch processing. This is due to carbon-based layers being able to provide more robust (e.g., more selective) etch selectivity during contact trench etch processing than the S/D material it is preserving (e.g., Si, SiGe, Ge, group III-V semiconductor material, etc.) and other etch stop layers (e.g., insulator material-based etch stop layers). In some embodiments, the carbon-based ESL is formed on S/D material prior to forming overlying insulator material (e.g., interlayer dielectric (ILD) material), such that the carbon-based ESL is already formed on the S/D material come time for contact trench etch processing. In this manner, the carbon-based layer can act as an etch stop during the contact trench etch to prevent (or reduce) the removal of S/D material during that contact trench etch. In some embodiments, the contact trench etch may not remove any of the carbon-based ESL, such that the carbon-based ESL remains intact (or substantially intact) after the contact trench etch has been completed. In other embodiments, the contact trench etch may remove only a portion of the carbon-based ESL, such that a portion of the carbon-based ESL remains on the S/D material in the contact trench. In still other embodiments, the contact trench etch may completely remove the carbon-based ESL, such that the carbon-based ESL is absent in the contact trench. Regardless of whether the carbon-based ESL remains in the S/D contact trench locations, the carbon-based ESL can help protect the S/D material from being consumed, as the carbon-based ESL provides a more robust stopping point for the S/D contact trench etch than if the carbon-based ESL were not present at all.

In some embodiments, the carbon-based ESL includes non-carbon monocrystalline (or single-crystal) semiconductor material (e.g., group IV or III-V semiconductor material) alloyed with monocrystalline carbon (C), which may be referred to herein as "Z:C", where Z is the non-carbon semiconductor material. For instance, in some such embodiments, the carbon-based ESL may include Si alloyed with C, which may be represented as Si:C, to provide an example. In such an example, the Si alloyed with C is different than silicon carbide (SiC). In another embodiment, the carbon-based ESL may include InGaAs alloyed with C, which may be represented as InGaAs:C, to provide another example. Thus, additional examples include SiGe:C, Ge:C, GaAs:C, InP:C, and so forth. Note that the semiconductor material included in the carbon-based ESL may also include suitable n-type or p-type dopant. For instance, in embodiments where the carbon-based ESL includes group IV semiconductor materials (e.g., Si, SiGe, Ge), the group IV semiconductor material is alloyed with carbon and may also be p-type doped using a suitable acceptor (e.g., boron) or n-type doped using a suitable donor (e.g., phosphorous, arsenic), to provide some example cases. Also note that in some embodiments, the carbon-based ESL includes monocrystalline semiconductor material, such that the Z:C material includes a monocrystalline structure.

In some embodiments, the carbon-based layer may include a C concentration (by atomic percentage) in the range of 1-80% (or in a suitable subrange, such as in the subrange of 1-2, 1-5, 1-10, 1-20, 1-40, 1-60, 2-5, 2-10, 2-20, 2-50, 2-80, 5-10, 5-20, 5-50, 5-80, 10-20, 10-50, 10-80, 20-50, 20-80, or 50-80%), or some other suitable concentration value or range as will be apparent in light of this disclosure. For instance, in some embodiments, the carbon-based ESL may have a C concentration of approximately 1, 1.5, 2, 2.5, 3, 3.5, 4, 4.5, 5, 10, 15, 20, 25, 30, 35, 40, 45, 50, 60, 70, or 80%, or some other suitable value as can be understood based on this disclosure. In some embodiments, the carbon-based ESL may be formed to have a thickness in the range of 1-20 nm (e.g., in the subrange of 1-2, 1-3, 1-5, 1-10, 2-5, 2-10, 2-20, 5-10, 5-20, or 10-20 nm), or some other suitable thickness value or range as will be apparent in light of this disclosure. In some embodiments, the thickness and C concentration (by atomic percentage) may be inversely related, such that if a relatively thicker carbon-based ESL is employed (e.g., with a thickness of at least 8, 10, 12, or 15 nm, such as having a thickness in the range of 8-15 or 8-20 nm), then relatively lower C concentration may be included in the layer to ensure the ESL is adequately robust/resilient enough to effectively function (e.g., a C concentration in the range of 1-5%). Further, in some such embodiments, if a relatively thinner carbon-based ESL is employed (e.g., with a thickness of at most 5, 3, or 2 nm, such as having a thickness in the range of 1-2, 1-3, or 1-5 nm), then relatively higher C concentration may be used to ensure that the ESL is robust/resilient enough to effectively function (e.g., C concentration in the range of 20-50%). Numerous variations and configurations for the carbon-based ESL will be apparent in light of this disclosure.

The carbon-based ESL described herein may be referred to as a cladding layer or a cap layer, as it may be formed directly on the material of one or more S/D regions. For instance, in embodiments employing a planar transistor configuration, the carbon-based ESL layer may be formed directly on the top surface of the S/D regions to preserve the S/D region material during subsequent contact trench etch processing. In other embodiments, such as embodiments employing non-planar transistor configurations, the S/D regions may include three-dimensional structures (e.g., structures that protrude above the top plane of STI material), such as fin-like shaped three-dimensional structures and/or diamond-like shaped three-dimensional structures, where the carbon-based ESL is formed directly on multiple sides of a given S/D region three-dimensional structure, such that the material of the carbon-based ESL is directly proximate to multiple sides or surfaces of the three-dimensional structure. For instance, in some such embodiments, employing a carbon-based ESL can enable being able to make contact to an increased area of a three-dimensional S/D region, such as being able to access, for purposes of making contact, one or more sides or surfaces of the three-dimensional that would not be otherwise accessible (e.g., as the contact trench etch would consume the S/D material when exposing those sides or surfaces without the presence of the carbon-based ESL). Thus, employing a carbon-based ESL in such embodiments can allow access to lower sides/surfaces/portions of the three-dimensional structure via the contact trench etch to enable making contact to those lower sides/surfaces/portions of the three-dimensional structure, thereby increasing the contact area and reducing contact resistance. In other words, employing a carbon-based ESL can enable forming a contact stack around (e.g., proximate to additional sides or surfaces) a given S/D region having a three-dimensional structure. In any case, a carbon-based ESL can help preserve the material, size, and/or shape of a given S/D region to, for example, relatively increase the available S/D region contact area (e.g., compared to techniques that do not employ a carbon-based ESL for S/D regions).

In some embodiments, S/D regions formed using the techniques described herein may include a diamond-like three-dimensional structure, which may include {111} on the top surfaces. As is known in the art, the Miller index (111) is a notation in crystallography for planes in crystal lattices. The notation {111} denotes the set of all planes that are equivalent to Miller index (111), by the symmetry of the lattice. In some embodiments, a given S/D region including {111} faceting may be formed by re-growing the S/D region from a finned structure. In some such embodiments, by maintaining relatively high quality crystal material during the growth (e.g., keeping the interfaces/surface clean), an S/D region including {111} faceting can be achieved via any suitable deposition technique (e.g., CVD, MOCVD, PVD, MBE). In some embodiments, a {111} faceted surface of a Ge-rich S/D region may be represented by that surface including an angle of approximately 54.7 degrees (plus/minus 5 degrees) relative to, for example: the (001) plane; the main plane of the substrate; the top plane of the substrate; and/or the top plane of STI material. Note that in some embodiments, a final S/D region including {111} faceting may not include a top surface(s) with 100% {111} faceting, such that, in some embodiments, only up to 60, 65, 70, 75, 80, 85, 90, or 95% of the top surface(s) (by contact area) of the final S/D region may be {111} faceted. The reduction or attenuation in top surface {111} faceting of a given S/D region may be based on the original shape of the given S/D as formed and/or based on subsequent processing after the given S/D region is formed (e.g., as a result of contact trench etch processing). Regardless, even such S/D regions with less than 100% {111} faceting may be desired, in some embodiments. In yet other embodiments, the terminal surface of a given S/D region may have no preferred crystallographic plane. For instance, in some such embodiments, the top of a given S/D region may be round, oval, curved, or irregularly shaped (e.g., with no discernible crystallographic plane common to a major portion of the top of that given S/D region). Even these other embodiments will benefit from the use of a carbon-based ESL as described herein.

In some embodiments, a carbon-based ESL may be used to preserve one or both of the S/D regions of a transistor including Ge-rich material (e.g., SiGe or Ge) in the channel region and/or in one or both of the S/D regions. However, the present disclosure is not intended to be so limited, as a carbon-based ESL as described herein can benefit transistors including a multitude of semiconductor materials. In some embodiments, a given Ge-rich channel region or S/D region may include any suitable Ge concentration (by atomic percentage), such as Ge in the range of 50-100% (or in any suitable subrange, such as in the subrange of 50-60, 50-70, 50-80, 50-90, 60-70, 60-80, 60-90, 60-100, 70-80, 70-90, 70-100, 80-90, 80-100, or 90-100%), or any other suitable value or range as will be apparent in light of this disclosure. In some embodiments, a given Ge-rich channel region or S/D region may include a Ge concentration (by atomic percentage) of at least 50, 55, 60, 65, 70, 75, 80, 85, 90, or 95%, for example. In some embodiments, for a given transistor device, the channel region and at least one S/D region may include similar Ge concentrations (by atomic percentage), such that their Ge concentrations are within 1, 2, 3, 4, 5, or 10%, for example; however, the present disclosure is not intended to be so limited unless otherwise stated. In some embodiments, a given Ge-rich channel region may be intrinsic/undoped (or nominally undoped, with a dopant concentration of less than 1E16 atoms per cubic cm) or it may include any suitable dopant type (e.g., n-type or p-type) and dopant concentration (e.g., in the range of 1E17-5E22 atoms per cubic cm). In some embodiments, a given Ge-rich S/D region may include any suitable dopant type (e.g., n-type or p-type) and dopant concentration (e.g., in the range of 1E17-5E22 atoms per cubic cm), as will be apparent in light of this disclosure.

Employing a carbon-based ESL as variously described herein provides numerous benefits. For instance, because it is desirable to completely remove the insulator material over the S/D regions during the contact trench etch, the carbon-based ESL provides additional flexibility for stopping the contact trench etch as the carbon-based ESL need not be completely removed for the device to effectively operate. Therefore, employing a carbon-based ESL on the S/D material provides a larger window for when to stop contact trench etch processing for a given S/D region and also compensates for imperfections during transistor fabrication. For example, prior to the contact trench etch processing, if there is at least, e.g., a 5% difference in the insulator material thickness over the source region compared to the insulator thickness over the drain region for a given transistor, employing a carbon-based ESL can allow the insulator material to be completely consumed from above the region including the relatively greater insulator material thickness without consuming material from the other region, due to the carbon-based ESL having a slower relative etch rate than the insulator material, in accordance with some embodiments. In addition, the carbon-based ESL may preserve and/or protect desired portions of a given S/D region. For instance, employing a carbon-based ESL may enable making contact to an increased area of a three-dimensional S/D region, as the contact trench etch can remove insulator material around the sides or surfaces of the three-dimensional S/D region without consuming the top of the S/D region, due to the S/D region being protected by the carbon-based ESL, in accordance with some embodiments. Note that preserving S/D material during contact trench etch processing as described herein can include completely preventing any removal of the S/D material during contact trench etch, minimizing the removal of the S/D material during contact trench etch, preserving the quality of the S/D material (e.g., preserving the high quality of the outer surfaces of the S/D material), preserving the shape of the S/D material, and/or any other benefit as can be understood based on this disclosure. The carbon-based ESL also helps provide a controlled repeatable location for stopping the contact trench etch, in accordance with some embodiments.

In some embodiments, the techniques can be used to benefit a multitude of transistor devices. For instance, in some embodiments, the techniques may be used to benefit metal-oxide-semiconductor field-effect transistors (MOSFETs), tunnel FETs (TFETs), fermi-filter FETs (FFFETs), and/or any other suitable FET or transistor device, as can be understood based on this disclosure. Further, in some embodiments, the techniques may be used to benefit one or more n-channel transistor devices (where the charge carriers are electrons) and/or p-channel transistor devices (where the charge carriers are holes), such as n-channel MOSFET (n-MOS) devices and/or p-channel MOSFET (p-MOS) devices. In some embodiments, the techniques described herein can be used to benefit complementary transistor circuits, such as CMOS circuits, where the techniques employing a carbon-based ESL can be used to benefit one or more of the included n-channel and/or p-channel transistors making up a given CMOS circuit. Further still, in some embodiments, the techniques described herein can be used to benefit transistors including a multitude of configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. Other example transistor devices that can benefit from the techniques described herein include few to single electron quantum transistor devices, for example.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including at least one transistor that includes source and drain (S/D) regions adjacent a channel region, where a carbon-based ESL is directly on at least a portion of one or both of the S/D regions. In other words, the carbon-based ESL may be directly proximate to at least a portion of one or both of the S/D regions, such that carbon is directly adjacent to at least a portion of one or both of the source and drain regions. As can be understood based on this disclosure, carbon would not be present directly on or proximate to at least one of the S/D regions without utilizing the techniques described herein that employ a carbon-based ESL to provide numerous benefits as previously described.

In some embodiments, use of the carbon-based ESL may be detected, in cases where that carbon-based ESL is not completely consumed during contact trench etch processing, based on carbon being present at the interface between an S/D region and its corresponding contact, whether it is present as a distinct layer at the interface or as carbon content that has dissolved into the S/D region, the contact, or both features. For example, the carbon may become a part of the intermetallic (the location where resistance lowering metal of the contact region and semiconductor material from the ESL and S/D region react), with a portion of the carbon potentially remaining in the semiconductor S/D region. In some such cases, the dissolved carbon may be present in the range of 1 to 20 percent, for example. In some such embodiments, carbon would not otherwise be present at or near the S/D-contact interface, as can be understood based on this disclosure. In embodiments where the carbon-based ESL is completely consumed during contact trench etch processing, use of the carbon-based ESL as described herein may be detected based on its presence elsewhere in the structure, such as directly on at least a portion of a given S/D where the contact trench did not access the given S/D region. In some embodiments, the techniques and structures described herein may be detected based on the benefits derived therefrom, such as the contact resistance reducing benefits gained by increasing the accessibly surface area of a given S/D region for which to make contact. Numerous configurations and variations will be apparent in light of this disclosure.

Architecture and Methodology

FIG. 1 illustrates method 100 of forming an integrated circuit (IC) including one or more transistors employing a carbon-based etch stop layer (ESL) for preserving source and drain material during contact trench etch processing, in accordance with some embodiments of the present disclosure. FIGS. 2A-L illustrate example IC structures that are formed when carrying out method 100 of FIG. 1, in accordance with some embodiments. The structures of FIGS. 2A-L are primarily depicted and described herein in the context of forming finned or FinFET transistor configurations (e.g., tri-gate transistor configurations), for ease of illustration. However, in some embodiments, the techniques can be used to form transistors of any suitable geometry or configuration, as can be understood based on this disclosure. For example, FIG. 2J illustrates an example IC structure including transistors with nanowire configurations, as will be described in more detail below. Also note that the techniques and structures are primarily depicted and described in the context of forming metal-oxide-semiconductor field-effect transistors (MOSFETs). However, the present disclosure is not intended to be so limited unless stated otherwise. Further note that method 100 includes a primary path that illustrates a gate last transistor fabrication process flow, in accordance with some embodiments. However, in other embodiments, a gate first process flow may be used, as will be described herein (and which is illustrated with the alternative gate first flow 100' indicator in FIG. 1). Numerous variations and configurations will be apparent in light of this disclosure.

A multitude of different transistors and transistor-based devices can benefit from the techniques described herein, which may include, but are not limited to, field-effect transistors (FETs), metal-oxide-semiconductor FETs (MOSFETs), tunnel FETs (TFETs), and Fermi filter FETs (FFFETs), to name a few examples. For example, the techniques may be used to benefit either or both of the S/D regions of an n-channel MOSFET (n-MOS) device, which may include a source-channel-drain doping scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit either or both of the S/D regions of a p-channel MOSFET (p-MOS) device, which may include a source-channel-drain doping scheme of p-n-p or p-i-p, in accordance with some embodiments. In yet another example, the techniques may be used to benefit either or both of the S/D regions of a TFET device, which may include a source-channel-drain doping scheme of p-i-n or n-i-p, in accordance with some embodiments. In still another example, the techniques may be used to benefit one or both of the S/D regions of a FFFET device, which may include a source-channel-drain doping scheme of np-i-p (or np-n-p) or pn-i-n (or pn-p-n), in accordance with some embodiments. Further, the techniques may be used to benefit complementary transistor circuits, such as CMOS circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 2A:
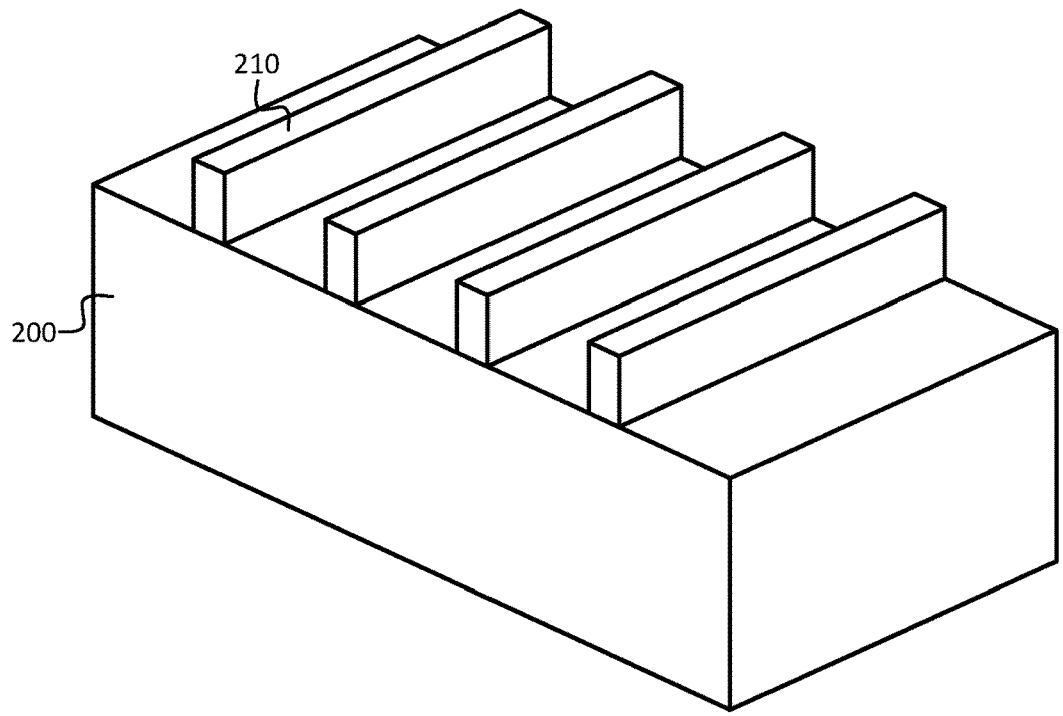

Method 100 of FIG. 1 includes patterning 102 hardmask on a substrate, such as patterning hardmask 210 on substrate 200 to form the example structure of FIG. 2A, in accordance with some embodiments. In some embodiments, hardmask 210 may be deposited or otherwise formed on substrate 200 using any suitable techniques as will be apparent in light of this disclosure. For example, hardmask 210 may be blanket deposited or otherwise grown on substrate 200 using chemical vapor deposition (CVD), atomic layer deposition (ALD), physical vapor deposition (PVD), spin-on processing, and/or any other suitable process to form hardmask 210 on substrate 200. In some instances, the top surface of substrate 200 on which hardmask 210 is to be deposited may be treated (e.g., via chemical treatment, thermal treatment, etc.) prior to deposition of the hardmask 210 material. After being blanket formed on substrate 200, hardmask 210 may then be patterned using any suitable techniques, such as one or more lithography and etch processes, for example. Hardmask 210 may include any suitable material, such as oxide material, nitride material, and/or any other suitable dielectric material, for example. Specific oxide and nitride materials may include silicon oxide, titanium oxide, hafnium oxide, aluminum oxide, silicon nitride, and titanium nitride, just to name a few examples. In some cases, the material of hardmask 210 may be selected based on the material of substrate 200, for example.

Substrate 200, in some embodiments, may be: a bulk substrate including group IV semiconductor material, such as silicon (Si), germanium (Ge), silicon germanium (SiGe), or silicon carbide (SiC), and/or group III-V material and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped (such as including a dopant concentration of less than 1E16 atoms per cubic cm), for example.

In some embodiments, substrate 200 may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers shown in subsequent structures for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2B:
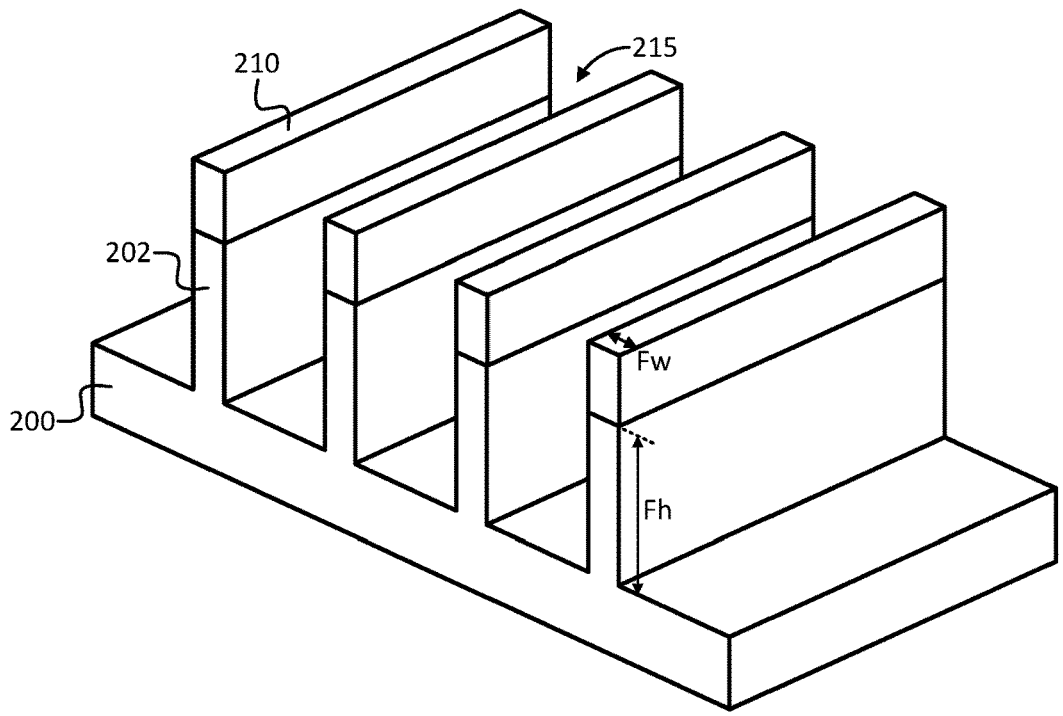

Method 100 of FIG. 1 continues with performing 104 shallow trench recess (STR) etch to form fins 202 from substrate 200, thereby forming the resulting example structure shown in FIG. 2B, in accordance with some embodiments. In some embodiments, the STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 215 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 215 between fins 202. Fins 202 may be formed to have varying widths Fw (dimension in the X-axis direction) and heights Fh (dimension in the Y-axis direction). For example, in a trench fill integration scheme, the fins may be formed to have particular height to width ratios such that when they are later removed or recessed, the resulting trenches formed allow the replacement material deposited to grow vertically from the native substrate bottom and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate (such that the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin (e.g., the misfit dislocations occur at levels below 1E5 dislocations per square cm).

In some embodiments, the fin widths Fw may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 215 and fins 202 are each shown as having essentially the same sizes and shapes in this example structure for ease of illustration; however, the present disclosure is not intended to be so limited. For example, in some embodiments, the fins 202 may be formed to have varying heights Fh, varying widths Fw, varying starting points (or varying starting heights), varying shapes, and/or any other suitable variations as will be apparent in light of this disclosure. Moreover, trenches 215 may be formed to have varying depths, varying widths, varying starting points (or varying starting depths), varying shapes, and/or any other suitable variations as will be apparent in light of this disclosure. Further note that although four fins 202 are shown in the example structure of FIG. 2B for ease of illustration, any number of fins may be formed, such as one, two, three, five, ten, hundreds, thousands, millions, billions, and so forth, as can be understood based on this disclosure.

Figure 2C:
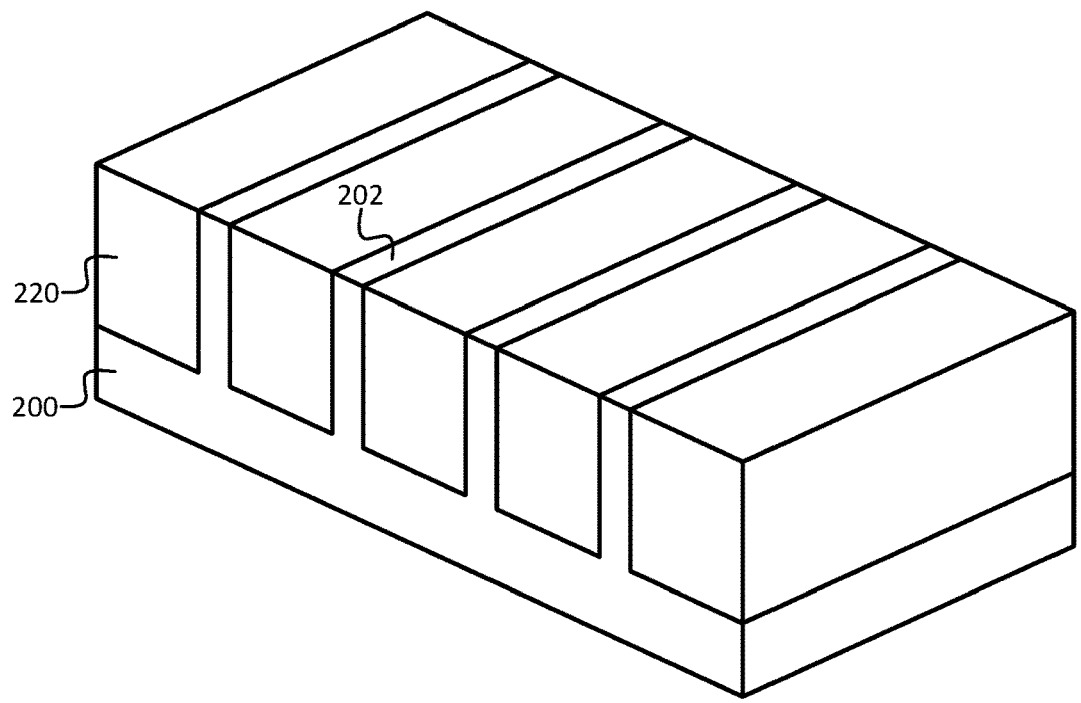

Method 100 of FIG. 1 continues with depositing 106 shallow trench isolation (STI) material 220 and planarizing/polishing the structure to form the example resulting structure of FIG. 2C, in accordance with some embodiments. In some embodiments, deposition 106 of STI material 220 may include any suitable deposition techniques, such as those described herein (e.g., CVD, ALD, PVD), or any other suitable deposition process. In some embodiments, STI material 220 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 220 may selected based on the material of substrate 200. For instance, in the case of a Si substrate, the STI material may be selected to be silicon dioxide or silicon nitride, to provide some examples. In some embodiments, the planarizing and/or polishing process(es) performed after forming STI material 220 may include any suitable techniques, such as chemical-mechanical planarization/polishing (CMP) processes, for example.

Figure 2D:
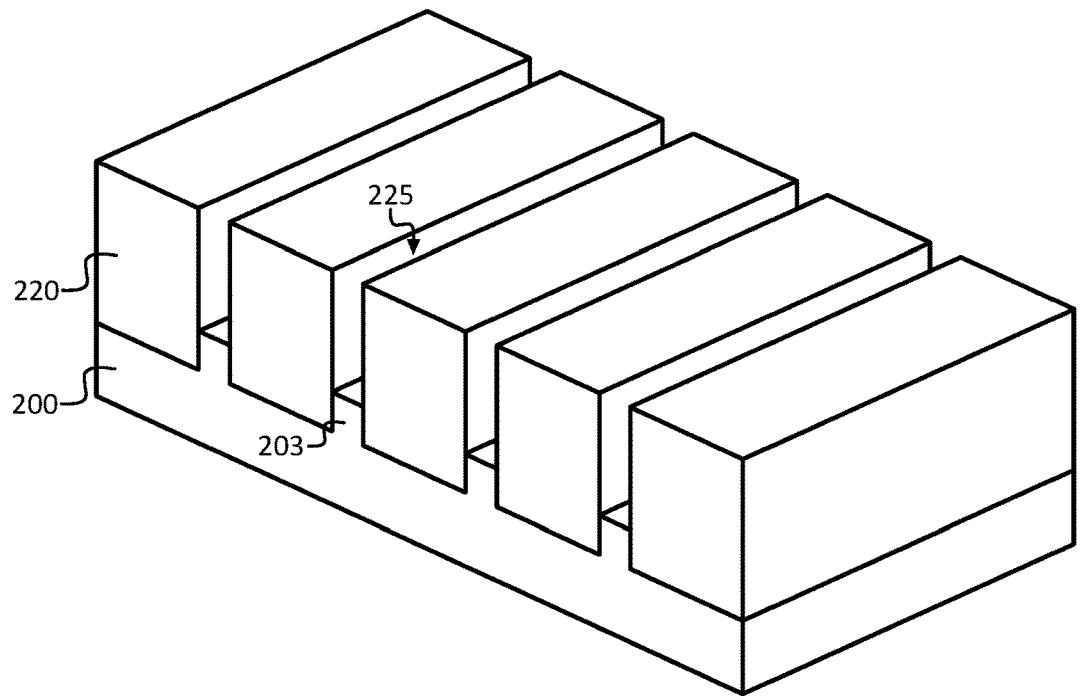

Method 100 of FIG. 1 continues with etching 108 fins 202 to form fin-shaped trenches 225 between the STI material 220 as shown in the resulting example structure of FIG. 2D, in accordance with some embodiments. In some embodiments, etching 108 may be performed using any suitable techniques, such as one or more wet and/or dry etch processes that selectively remove the material of fins 202 relative to the STI material 220 to form fin-shaped trenches 225, and/or any other suitable processing as will be apparent in light of this disclosure. As shown in the example embodiment of FIG. 2D, a sub-fin portion 203 from fins 202 remains below fin-shaped trenches 225, where the height (dimension in the Y-axis direction) of the sub-fin portion 203 may be based on the etch processing 108 used form fin-shaped trenches 225. For example, in some embodiments, the etch processing 108 may be performed with characteristics (e.g., a longer etch duration) that removes relatively more of fins 202, such that a shorter (by height) sub-fin portion 203 may remain or the fins 202 may be completely removed, such that the fin-shaped trenches 225 extend to the bottom of STI material 220 and possibly beyond. However, in other embodiments, the etch processing 108 may be performed with characteristics (e.g., a shorter etch duration) that result in removing relatively less material of fins 202, such that a taller (by height) sub-fin portion 203 may remain. Regardless, fin-shaped trenches 225 may have similar (or the same) widths (dimension in the X-axis direction) as the width (Fw) of fins 202 that were removed and/or fin-shaped trenches 225 may have similar (or the same) depths (dimension in the Y-axis direction) as the height (Fh) of fins 202 that were removed, in accordance with some embodiments.

Method 100 of FIG. 1 continues with depositing 110 replacement material to form replacement material fins 230 in the fin-shaped trenches 225, thereby forming the example resulting structure of FIG. 2E, in accordance with some embodiments. In some such embodiments, deposition 110 of the replacement material may include any suitable techniques, such as CVD, metalorganic CVD (MOCVD), PVD, ALD, molecular beam epitaxy (MBE), and/or any other suitable process as can be understood based on this disclosure. As can also be understood based on this disclosure, in some embodiments, deposition processing 110 may be followed by planarization/polish processing (e.g., via CMP) to form the structure of FIG. 2E, in accordance with some embodiments. As can further be understood based on this disclosure, replacement material fins 230 may be used in the channel region(s) of one or more transistors, such that the material of fins 230 may also material included in those channel regions.

In some embodiments, replacement material fins 230 may include any suitable semiconductor material as will be apparent in light of this disclosure, such as group IV and/or group III-V semiconductor material. In some such embodiments, replacement material fins 230 may include Ge-rich material, such as Ge or SiGe with at least 50% Ge concentration (by atomic percentage). Thus, in such embodiments where the replacement material fins 230 include Ge-rich material, the Ge concentration may be in the range of 50-100% (or in any suitable subrange, such as in the subrange of 50-60, 50-70, 50-80, 50-90, 60-70, 60-80, 60-90, 60-100, 70-80, 70-90, 70-100, 80-90, 80-100, or 90-100%), or any other suitable value or range as will be apparent in light of this disclosure. In some embodiments, replacement material fins 230 may include a Ge concentration (by atomic percentage) of at least 50, 55, 60, 65, 70, 75, 80, 85, 90, or 95%, for example. Generally, in some embodiments, replacement material fins 230 may include Si, SiGe, Ge, GaAs, InGaAs, InP, GaSb, or InSb, to provide a few suitable semiconductor materials. In some embodiments, replacement material fins 230 may include semiconductor material that is intrinsic/undoped (or nominally undoped with a dopant concentration of less than 1E16 atoms per cubic cm), n-type doped, p-type doped, or some combination thereof (e.g., doped in some portions and undoped in other portions, or p-type doped in some portions and n-type doped in other portions). In some embodiments, replacement material fins 230 may include grading (e.g., increasing and/or decreasing) of the concentration of one or more materials within the features, such as graded Ge concentration throughout a given fin and/or graded dopant concentration throughout a given fin, for example. In some embodiments, replacement material fins 230 may include a multilayer structure that includes at least two distinct layers. For example, in embodiments employed to form a nanowire transistor, a given replacement material fin may include at least one layer to be formed into at least one nanowire in the channel region of the transistor and at least one sacrificial layer (which may alternate with the at least one nanowire layer) to be selectively etched and removed to release the at least one nanowire layer, as can be understood based on this disclosure.

Note that the replacement material fins 230 are all shown as including the same material, in the example structure of FIG. 2E, for ease of illustration; however, the present disclosure is not intended to be so limited. For instance, in some embodiments, a subset of fins 202 may be masked to allow for the removal and replacement of those original fins 202 with a first replacement material to form first replacement material fins, followed by masking of the first replacement material fins to allow for the removal and replacement of the subset of fins 202 that were masked with a second replacement material compositionally different from the first to form second replacement material fins, thereby enabling the formation of two compositionally different replacement material fins. Such processing could be repeated as many times as desired to form any desired number of replacement material fin subsets. In some embodiments, one or more of the original fins 202 that are native to substrate 200 may be kept to be processed into one or more transistor devices. In other words, in some embodiments, transistors formed using the techniques described herein may include channel regions including semiconductor material native to substrate 200, first replacement material, second replacement material, third replacement material, and/or any other suitable number replacement material, as can be understood based on this disclosure. In any case, the native material or replacement material can be monocrystalline semiconductor material that is of sufficient transistor device quality, as it is either from or formed on the semiconductor material of substrate 200, in accordance with some embodiments.

Method 100 of FIG. 1 continues with recessing 112 the STI material 220 to form the example resulting structure of FIG. 2F, in accordance with some embodiments. In some embodiments, recessing 112 may be performed using any suitable techniques, such as using one or more wet and/or dry etch processes that allow the STI material 220 to be selectively recessed relative to the replacement fin 230 material, and/or any other suitable processing as will be apparent in light of this disclosure. As shown in FIG. 2F, the recessing 112 allows replacement material fins 230 to exude from the STI material 220 (and more specifically, from the top plane of STI layer 220), for example, such that the replacement material fins 230 can be subsequently processed into one or more transistor devices. As is also shown, sub-fin portions 203 (that are native to substrate 200, in this example embodiment) are below the top plane of STI layer 220. Note that in this example embodiment, the top plane of STI layer 220 is exactly at the level of the interface between replacement fins 230 and sub-fin portions 203; however, the present disclosure is not intended to be so limited. For example, STI material 220 may have been recessed more or less (to a higher or lower point in the Y-axis direction), in other embodiments.

In this example embodiment, the width (dimension in the X-axis direction) of replacement material fins 230 is the same as the width of fins 202 (i.e., width Fw) previously described.

However, the height (dimension in the Y-axis direction) of replacement material fins 230 is less than the height of fins 202 (i.e., height Fh). The height of the replacement material fins 230 may be referred to as the active fin height Fah, as that height of a given fin 230 may be used in the channel region of a transistor formed therefrom, in accordance with some embodiments. In some embodiments, the height of replacement material fins 230, shown as Fah, may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the replacement material fins 230 of the example structure of FIG. 2F may be formed using alternative processing (as opposed to the replacement fin scheme described herein with reference to FIGS. 2A-F). For instance, in some embodiments, replacement material fins 230 may be formed by blanket-growing the replacement material on the substrate (e.g., using epitaxial deposition processing) and then patterning the replacement material into replacement material fins, to provide an example alternative. Such an example alternative process may also include forming STI material between the replacement material fins and recessing the material to form a structure similar to that shown in FIG. 2F, for instance.

Figure 2G:
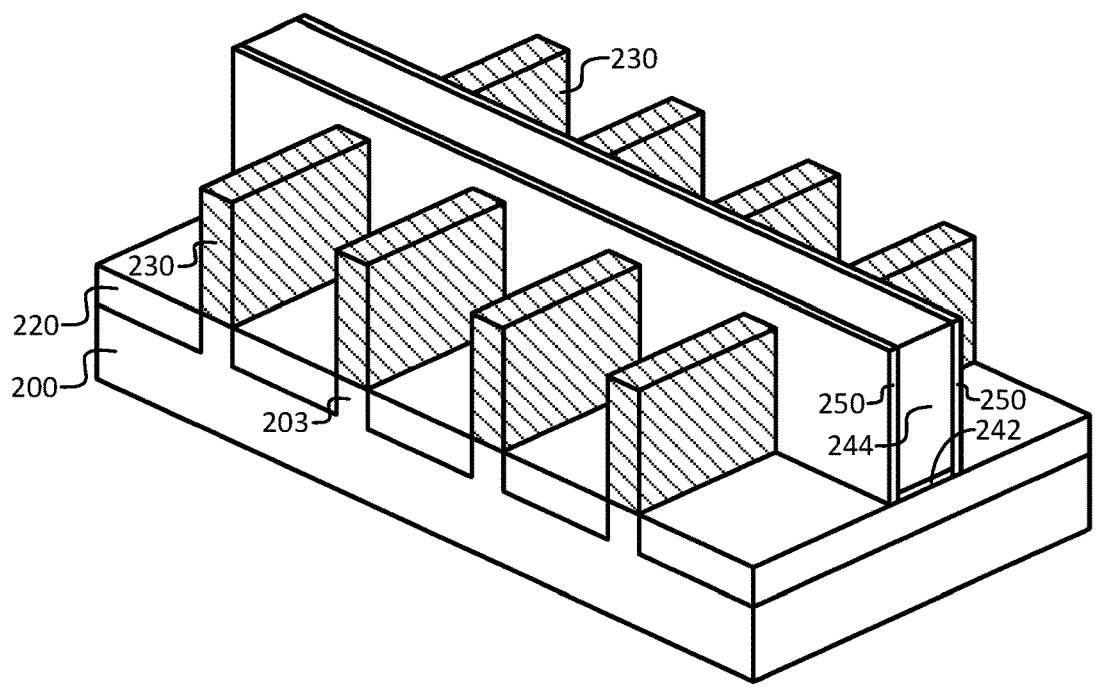

Method 100 of FIG. 1 continues with optionally forming 114 a dummy gate stack to form the example resulting structure of FIG. 2G, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 114—forming a dummy gate stack—would not be performed, and thus, process 114 may be optional in some embodiments (such as those employing the gate first process flow). This is reflected with the alternative location for performing 122 final gate stack processing, which is shown as the optional gate first flow 100' in FIG. 1, where performing 122 the final gate stack processing may occur prior to performing 116 S/D region processing, for example. However, the description of method 100 will continue using a gate last process flow, to allow for such a flow (which typically includes additional processing) to be adequately described.

Continuing with forming 114 a dummy gate stack, such a dummy gate stack (where employed) may include dummy gate dielectric 242 and dummy gate electrode 244, thereby forming the example resulting structure of FIG. 2G, in this example embodiment. In this example embodiment, dummy gate dielectric 242 (e.g., dummy oxide material) and dummy gate electrode 244 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and can help with replacement gate processes, for example. As can be understood based on this disclosure, the dummy gate stack (and spacers 250) can help define the channel region and source/drain (S/D) regions of each fin, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration. Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2G, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, as previously described, the techniques described herein need not include forming a dummy gate stack, such that a final gate stack may be formed in the first instance. Regardless, the end structure will include the final gate stack, as will be apparent in light of this disclosure. Also note that in some embodiments, a hardmask (not shown) may be formed over the dummy gate stack (which may or may not also be formed over spacers 250) to protect the dummy gate stack during subsequent processing, for example.

Figure 2H:
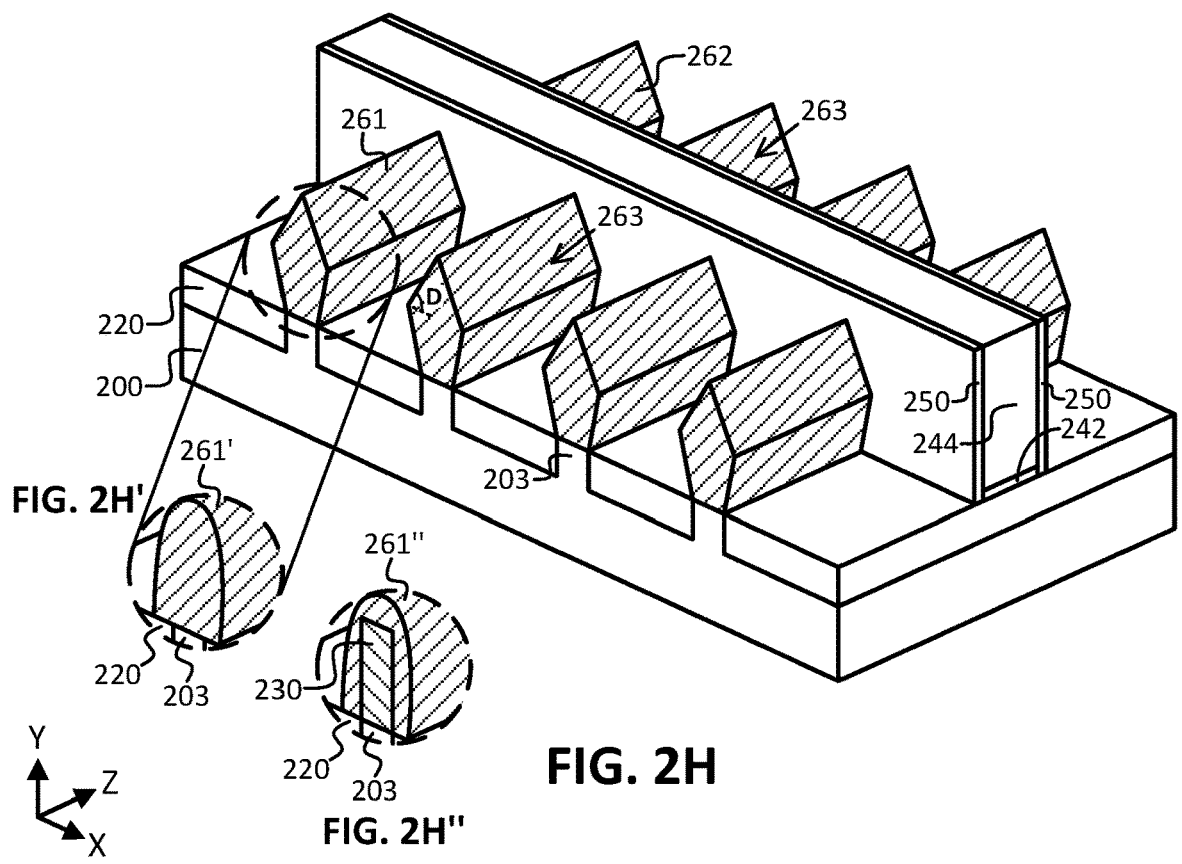

Method 100 of FIG. 1 continues with performing 116 source and drain (S/D) region processing to form the example resulting structure of FIG. 2H, in accordance with some embodiments. In this example embodiment, the S/D processing 116 included removing and replacing the S/D material to form S/D regions 261/262 as shown in FIG. 2H. In some embodiments, removing replacement material fins 230 in the S/D regions (the regions not covered by the dummy gate stack, in this example embodiment) may include any suitable techniques, such as one or more wet and/or dry etch processes, for example. Further, in some embodiments, replacing the S/D material with replacement S/D regions 261/262 can be performing using any suitable techniques, such as one or more of the depositions processes described herein (e.g., CVD, MOCVD, ALD, PVD, MBE), and/or any other suitable processes as will be apparent in light of this disclosure. In some such embodiments, the replacement S/D regions 261/262 may be formed using a selective deposition process, e.g., such that the S/D material only or primarily grows (or only grows in a monocrystalline structure) from the exposed semiconductor material sub-fin portions 203, as can be understood based on this disclosure. Note that the S/D regions 261/262 are referred to herein as such, but each S/D region 261 may be either a source region or a drain region, such that the corresponding S/D region 262 (on the other side of dummy gate stack) is the other of the source region and drain region, thereby forming a source and drain region pair. As shown in FIG. 2H, there are four different S/D region 261/262 pairs.

In addition, in the example embodiment of FIG. 2H, the S/D regions 261/262 each include $\{111\}$ faceting on the top surfaces, where one of those top surfaces of the S/D regions is indicated as 263 in FIG. 2H (the other surface is behind the surface indicated as 263, which cannot be seen in the view of FIG. 2H). In other words, the upper-most surfaces (e.g., the surfaces farthest from substrate 200) include $\{111\}$ faceting, in this example embodiment. In some embodiments, a $\{111\}$ faceted surface 263 of a given S/D region 261/262 may be represented by that surface including an angle (illustrated in FIG. 2H as angle D) of approximately 54.7 degrees (plus/minus 5 degrees) relative to the (001) plane, the main plane of substrate 200, the top plane of substrate 200, and/or the top plane of STI layer 220, for example. In other words, the S/D regions 261/262 may be considered to be approximately diamond-shaped, where the $\{111\}$ faceted shape of the S/D regions 261/262 may be considered to be approximately pyramid-shaped, for example. However, a portion of the pyramid top may be removed, in some embodiments, such as is shown in FIG. 2L' (described in more detail below).

In some embodiments, the S/D regions 261/262 may have different shapes. For instance, FIG. 2H' is a blown-out portion of FIG. 2H, illustrating an alternative rounded S/D region 261' that may be formed, in accordance with some embodiments. As shown, rounded S/D region 261' includes a rounded and unfaceted top, and the rounded or curved S/D region 261' also extends past the underlying sub-fin portion 203 in the X-axis direction. As can be understood based on this disclosure, S/D regions including any shape (such as the diamond shape of S/D regions 261/262 or the rounded shape of S/D region 261') can benefit from a carbon-based ESL as described herein. For instance, the carbon-based ESL can enable preserving and/or gaining access to an increased amount of surface area for which to make electrical contact to via the S/D contacts, for example. FIG. 2H" is a blown-out portion of FIG. 2H, illustrating that a final S/D region can alternatively be formed by depositing one or more cladding layers on a replacement fin 230 of FIG. 2G, in accordance with some embodiments. In the example embodiment of FIG. 2H", cladding layer 261" was formed on replacement fin 230 as shown to form the final S/D region. Thus, the final S/D regions can be formed using any suitable techniques, as can be understood based on this disclosure. Note that the relevant description of S/D regions 261/262 herein (e.g., included materials and doping schemes) is equally applicable to features 261' and 261".

In some embodiments, S/D regions 261/262 may include any suitable semiconductor material as will be apparent in light of this disclosure, such as group IV and/or group III-V semiconductor material. In some such embodiments, one or both of the S/D regions 261/262 may include Ge-rich material, such as Ge or SiGe with at least 50% Ge concentration (by atomic percentage). Thus, in such embodiments where a given S/D region includes Ge-rich material, the Ge concentration may be in the range of 50-100% (or in any suitable subrange, such as in the subrange of 50-60, 50-70, 50-80, 50-90, 60-70, 60-80, 60-90, 60-100, 70-80, 70-90, 70-100, 80-90, 80-100, or 90-100%), or any other suitable value or range as will be apparent in light of this disclosure. In some embodiments, a given S/D region may include a Ge concentration (by atomic percentage) of at least 50, 55, 60, 65, 70, 75, 80, 85, 90, or 95%, for example. In some embodiments, S/D regions 261/262 may include semiconductor material that is n-type doped and/or p-type doped. In some embodiments, a given S/D region may include grading (e.g., increasing and/or decreasing) of the concentration of one or more materials within the features, such as the grading of the Ge concentration and/or the grading of the dopant concentration, for example. For instance, in some such embodiments, the dopant concentration (e.g., n-type dopant concentration) included in a given S/D region may be graded such that it is lower near the channel region and higher near the {111} faceted surfaces, which may be achieved using any suitable processing, such as tuning the amount of dopant in the reactant flow (e.g., during an in-situ doping scheme). In some embodiments, a given S/D region may include a multilayer structure that includes at least two distinct layers.

Note that the S/D regions 261/262 are shown with different patterning than replacement fins 230 to merely assist with visual identification of the different features in the figures. However, the patterning/shading of any of the features in the figures is not intended to limit the present disclosure in any manner. Also note that S/D regions 261/262 are all shown as including the same material and sizes/shapes in the example structure of FIG. 2H, for ease of illustration;

however, the present disclosure is not intended to be so limited. For example, in some embodiments, one of the S/D regions in a corresponding S/D region pair (such as region 261 on one side of the dummy gate stack) may be processed separately than the other S/D region in that pair (such as region 262 on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type region may be processed separately from the p-type region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (which may be determined based on the material of replacement fins 230). However, in other embodiments, a given S/D region may include relatively different material composition (e.g., at least 1, 2, 3, 4, 5, or 10% different) compared to the corresponding/adjacent channel region, for example.

Method 100 of FIG. 1 continues with forming 118 a carbon-based etch stop layer (ESL) on desired S/D regions 261/262, in accordance with some embodiments. In some embodiments, the carbon-based ESL 265 may be formed on the S/D regions 261/262 using any suitable techniques, such as using one or more deposition processes described herein (e.g., CVD, MOCVD, ALD, PVD, MBE), and/or any other suitable processes as will be apparent in light of this disclosure. In some embodiments, the carbon-based ESL 265 may only or primarily be formed on S/D regions 261/262 using, e.g., a selective deposition process. For instance, the carbon-based ESL material may not form on non-semiconductor material in the structure of FIG. 2H, such that it only or primarily forms on semiconductor material included in S/D regions 261/262, to provide an example. To provide another example, the carbon-based ESL material may only form in a relatively high-quality manner (e.g., in a monocrystalline manner) on the semiconductor material included in S/D regions 261/262, such that it is formed in a relatively lower-quality manner (e.g., in a polycrystalline or amorphous manner) elsewhere (such as on STI material 220, on spacers 250 and/or on dummy gate stack). In such an example, the relatively lower-quality material may be removed deliberately and/or as a result of subsequent processing, in accordance with some embodiments. As shown in the example structure of FIG. 2I, the carbon-based ESL 265 was formed on the entirety of each S/D region 261/262, such that the carbon-based ESL 265 may be considered a cladding layer, in this example embodiment. However, the present disclosure is not intended to be so limited, unless otherwise stated.

Figure 2I:
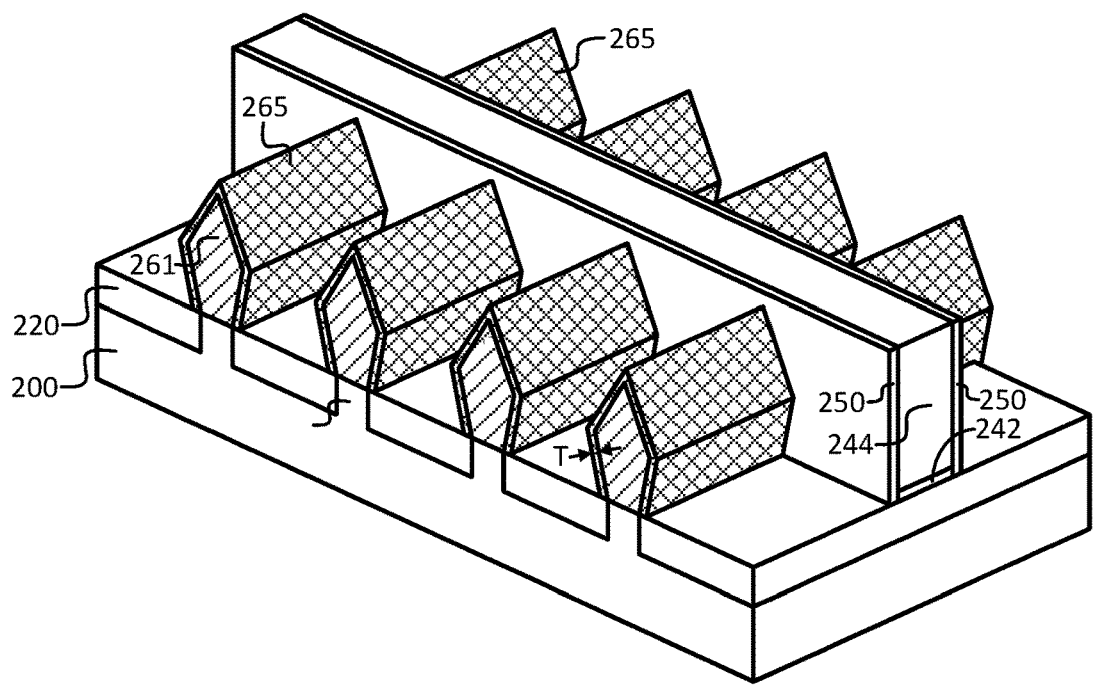
Figure 2J:
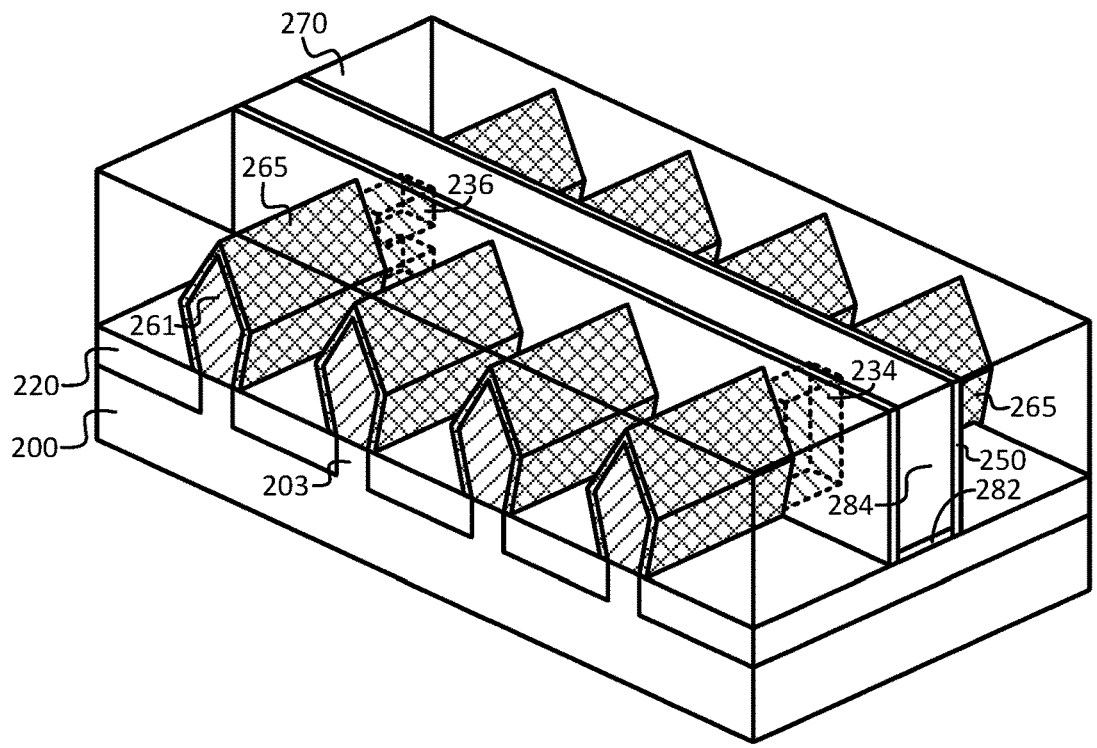

As shown in FIG. 2I, the carbon-based ESL 265 was formed on all S/D regions 261/262, in this example embodiment. However, in other embodiments, the carbon-based ESL 265 may only be formed on a subset of all S/D regions (e.g., by masking the subset of S/D regions on which carbon-based ESL is not to be formed prior to depositing the carbon-based ESL material). Further, in the example embodiment of FIG. 2I, each S/D region has a diamond-like shaped three-dimensional structure and the carbon-based ESL 265 is directly on and proximate to four sides/surfaces of each S/D region 261/262, as shown. However, even for such S/D regions including diamond-like shaped three-dimensional structures, the carbon-based ESL 265 need not be formed on all sides or surfaces of the structure and may only be formed (either completely or in part) directly on and thus proximate to 1, 2, or 3 sides or surfaces, for example. In some embodiments, the carbon-based ESL may be formed directly on and proximate to S/D regions including different shapes. For instance, in the case of fin-shaped S/D regions that primarily have three sides, the carbon-based ESL may be formed (either completely or in part) on only 1 or 2 sides, or on all 3 sides, for example. In embodiments employing a planar transistor configuration, the carbon-based ESL may only be formed directly on the top-most surface of the S/D region, for example. In embodiments employing a given S/D region with more than 4 sides, the carbon-based ESL may be formed on one or more or all of the sides/surfaces of that given S/D region. As will be apparent in light of this disclosure, carbon-based ESL 265 may be formed to help protect/preserve the material of the S/D regions 261/262 from being damaged and/or consumed (in part or in total) during subsequent processing, such as during contact trench etch processing, for example.

In some embodiments, the carbon-based ESL includes non-carbon monocrystalline (or single-crystal) semiconductor material (e.g., group IV or III-V semiconductor material) alloyed with monocrystalline carbon (C), which may be referred to herein as "Z:C", where Z is the non-carbon semiconductor material. For instance, in some such embodiments, the ESL may include Si alloyed with C, which may be represented as Si:C, to provide an example. In such an example, the Si alloyed with C is different than silicon carbide (SiC). In another embodiment, the ESL may include InGaAs alloyed with C, which may be represented as InGaAs:C, to provide another example. Thus, additional examples include SiGe:C, Ge:C, GaAs:C, InP:C, and so forth. Note that the semiconductor material included in the carbon-based ESL may also include suitable n-type or p-type dopant. For instance, in embodiments where the carbon-based ESL includes group IV semiconductor materials (e.g., Si, SiGe, Ge), the group IV semiconductor material is alloyed with carbon and may also be p-type doped using a suitable acceptor (e.g., boron) or n-type doped using a suitable donor (e.g., phosphorous, arsenic), to provide some example cases. Also note that in some embodiments, the carbon-based ESL includes monocrystalline semiconductor material, such that the Z:C material includes a monocrystalline structure. In some embodiments, a given S/D region on which the carbon-based ESL is deposited may not include carbon. Thus, in some such embodiments, the introduction of the carbon-based ESL 265 introduces carbon into the area that would not otherwise be there, as can be understood based on this disclosure.

In some embodiments, the carbon-based ESL 265 may include a C concentration (by atomic percentage) in the range of 1-80% (or in a suitable subrange, such as in the subrange of 1-2, 1-5, 1-10, 1-20, 1-40, 1-60, 2-5, 2-10, 2-20, 2-50, 2-80, 5-10, 5-20, 5-50, 5-80, 10-20, 10-50, 10-80, 20-50, 20-80, or 50-80%), or some other suitable concentration value or range as will be apparent in light of this disclosure. For instance, in some embodiments, the carbon-based ESL 265 may have a C concentration of approximately 1, 1.5, 2, 2.5, 3, 3.5, 4, 4.5, 5, 10, 15, 20, 25, 30, 35, 40, 45, 50, 60, 70, or 80%, or some other suitable value as can be understood based on this disclosure. In some embodiments, the carbon-based ESL may be formed to have a thickness T in the range of 1-20 nm (e.g., in the subrange of 1-2, 1-3, 1-5, 1-10, 2-5, 2-10, 2-20, 5-10, 5-20, or 10-20 nm), or some other suitable thickness value or range as will be apparent in light of this disclosure. Note that the thickness T of carbon-based ESL is shown as being the same around the entirety of each S/D region 261/262; however, in some embodiments, the carbon-based ESL 265 may be relatively thicker on some portions of a given S/D region than others, such as on the top portions, for example. In some embodiments, the thickness and C concentration (by atomic percentage) may be inversely related, such that if a relatively thicker carbon-based ESL 265 is employed (e.g., with a thickness of at least 8, 10, 12, or 15 nm, such as having a thickness in the range of 8-15 or 8-20 nm), then relatively lower C concentration may be included in the layer to ensure the ESL is adequately robust/resilient enough to effectively function (e.g., a C concentration in the range of 1-5%). Further, in some such embodiments, if a relatively thinner carbon-based ESL 265 is employed (e.g., with a thickness of at most 5, 3, or 2 nm, such as having a thickness in the range of 1-2, 1-3, or 1-5 nm), then relatively higher C concentration may be used to ensure that the ESL is robust/resilient enough to effectively function (e.g., C concentration in the range of 20-50%). Numerous variations and configurations for the carbon-based ESL will be apparent in light of this disclosure.

Method 100 of FIG. 1 continues with performing 120 the final gate stack processing to form the example resulting structure of FIG. 2J, in accordance with some embodiments. As shown in FIG. 2J, the processing in this example embodiment included depositing interlayer dielectric (ILD) layer 270 on the structure of FIG. 2I, followed by planarization and/or polishing (e.g., CMP) to reveal the dummy gate stack as shown. Note that ILD layer 270 is shown as transparent in the example structure of FIG. 2J to allow for the underlying features to be seen; however, the present disclosure is not intended to be so limited. Also note that ILD layer 270 may include a multilayer structure, even though it is illustrated as a single layer. Further note that in some cases, ILD layer 270 and STI material 220 may not include a distinct interface as shown in FIG. 2J, particularly where, e.g., the ILD layer 270 and STI material 220 include the same dielectric material. In some embodiments, the ILD layer 270 may include any suitable electrical insulator, dielectric, oxide (e.g., silicon oxide), and/or nitride (e.g., silicon nitride) material, as will be apparent in light of this disclosure. The gate stack processing, in this example embodiment, continued with removing the dummy gate stack (including dummy gate 244 and dummy gate dielectric 242) to allow for the final gate stack to be formed. Recall that in some embodiments, the formation of the final gate stack, which includes gate dielectric 282 and gate electrode 284, may be performed using a gate first flow (also called up-front hi-k gate). In such embodiments, the gate processing may have been performed after process 112 and prior to S/D region processing 116. However, in this example embodiment, the gate stack is formed using a gate last flow (also called a replacement gate or replacement metal gate (RMG) process). In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric 282 and gate electrode 284 as shown in FIG. 2J and described herein.

Note that when the dummy gate is removed, the channel region of replacement material fins 230 (that were covered by the dummy gate stack) are exposed to allow for any desired processing of the channel regions of the fins. Such processing of the channel region may include various different techniques, such as removing and replacing the channel region with replacement material, doping the channel region of the fin as desired, forming the fin into one or more nanowires (or nanoribbons) for a gate-all-around (GAA) transistor configuration, cleaning/polishing the channel region, and/or any other suitable processing as will be apparent in light of this disclosure. For instance, finned channel region 234 is illustrated (which is the channel region of the right-most of the four original finned structures) and that finned channel region may be a portion of replacement material fin 230 and/or it may have been processed in any suitable manner (e.g., removed and replaced with other replacement material, doped in a desired manner, etc.). To provide another example, nanowire channel region 236 (which is the channel region of the left-most of the four original finned structures) may have been formed after the dummy gate was removed and the channel regions of the fins were exposed, by converting the finned structure at that location into the nanowires 236 shown using any suitable techniques, for example. For instance, the original finned channel region may have included a multilayer structure, where one or more of the layers were sacrificial and were selectively etched to remove those sacrificial layers and release the nanowires 236. As shown in FIG. 2J, nanowire channel region 236 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration.

As can be understood based on this disclosure, the channel region is at least below the gate stack, in this example embodiment. For instance, in the case of a finned transistor configuration, the channel region may be below and between the gate stack, as the stack is formed on three sides as is known in the art. However, if the transistor device were inverted and bonded to what will be the end substrate, then the channel region may be above the gate. Therefore, in general, the gate and channel relationship may include a proximate relationship (which may or may not include one or more intervening gate dielectric layers and/or other suitable layers), where the gate is near the channel region such that it can exert control over the channel region in some manner (e.g., in an electrical manner), in accordance with some embodiments. Further, in the case of a nanowire (or nanoribbon or GAA) transistor configuration, the gate stack may completely surround each nanowire/nanoribbon in the channel region (or at least substantially surround each nanowire, such as surrounding at least 70, 80, or 90% of each nanowire). Further still, in the case of a planar transistor configuration, the gate stack may simply be above the channel region. In some embodiments, the channel region may include group IV semiconductor material (e.g., Si, SiGe, Ge), group III-V semiconductor material (e.g., GaAs, InGaAs, InAs), and/or any other suitable material as will be apparent in light of this disclosure. In some embodiments, the channel region may be doped (e.g., with any suitable n-type and/or p-type dopant) or intrinsic/undoped (or nominally undoped), depending on the particular configuration. For instance, in some such embodiments, the channel region may include Ge-rich material (e.g., Ge or SiGe with at least 50% Ge concentration) which may or may not be doped as desired (e.g., it may be doped with p-type dopant), to provide some examples.

Note that S/D regions 261/262 are adjacent to either side of a corresponding channel region, as can be seen in FIG. 2J, for example. More specifically, the S/D regions 261/262 are directly adjacent to a corresponding channel region, such that there are no intervening layers between either of the S/D regions and the channel region, in this example embodiment. However, the present disclosure is not intended to be so limited. Also note that the configuration/geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may structurally be very similar (or the same), but they include different doping schemes (e.g., source-drain doping schemes for MOSFET of p-p or n-n versus p-n or n-p for TFET).

Continuing with performing 120 final gate stack processing, after the dummy gate has been removed and any desired channel region processing has been performed, the final gate stack can then be formed, in accordance with some embodiments. In this example embodiment, the final gate stack includes gate dielectric 282 and gate electrode 284, as shown in FIG. 2J. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric 282 and/or gate electrode 284 may include a multilayer structure of two or more material layers, for example. In some embodiments, gate dielectric 282 and/or gate electrode 284 may include grading (e.g., increasing and/or decreasing) the content/concentration of one or more materials in at least a portion of the feature(s). Additional layers may be present in the final gate stack, in some embodiments, such as one or more work function layers or other suitable layers, for example. Note that although gate dielectric 282 is only shown below gate electrode 284 in the example embodiment of FIG. 2J, in other embodiments, the gate dielectric 282 may also be present on one or both sides of gate electrode 284, such that the gate dielectric 282 may also be between gate electrode 284 and one or both of spacers 250, for example. Numerous different gate stack configurations will be apparent in light of this disclosure.

Figure 2K:
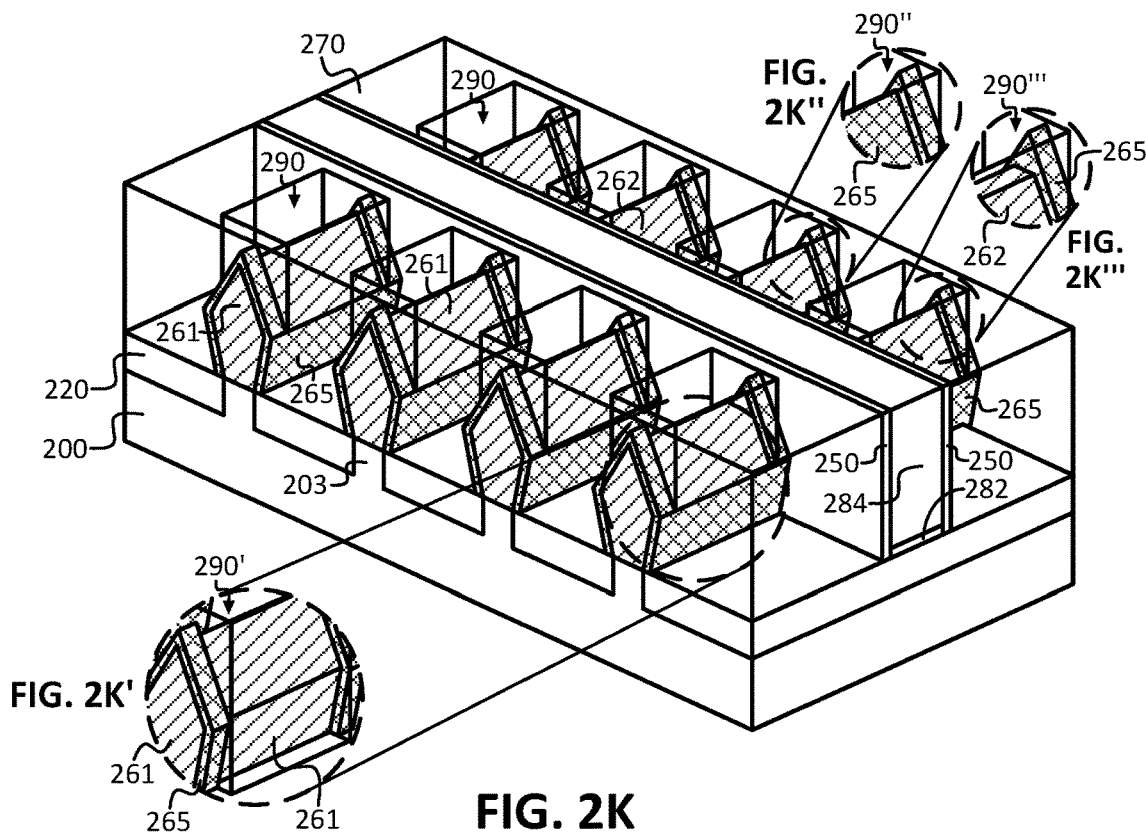
Figure 2L:
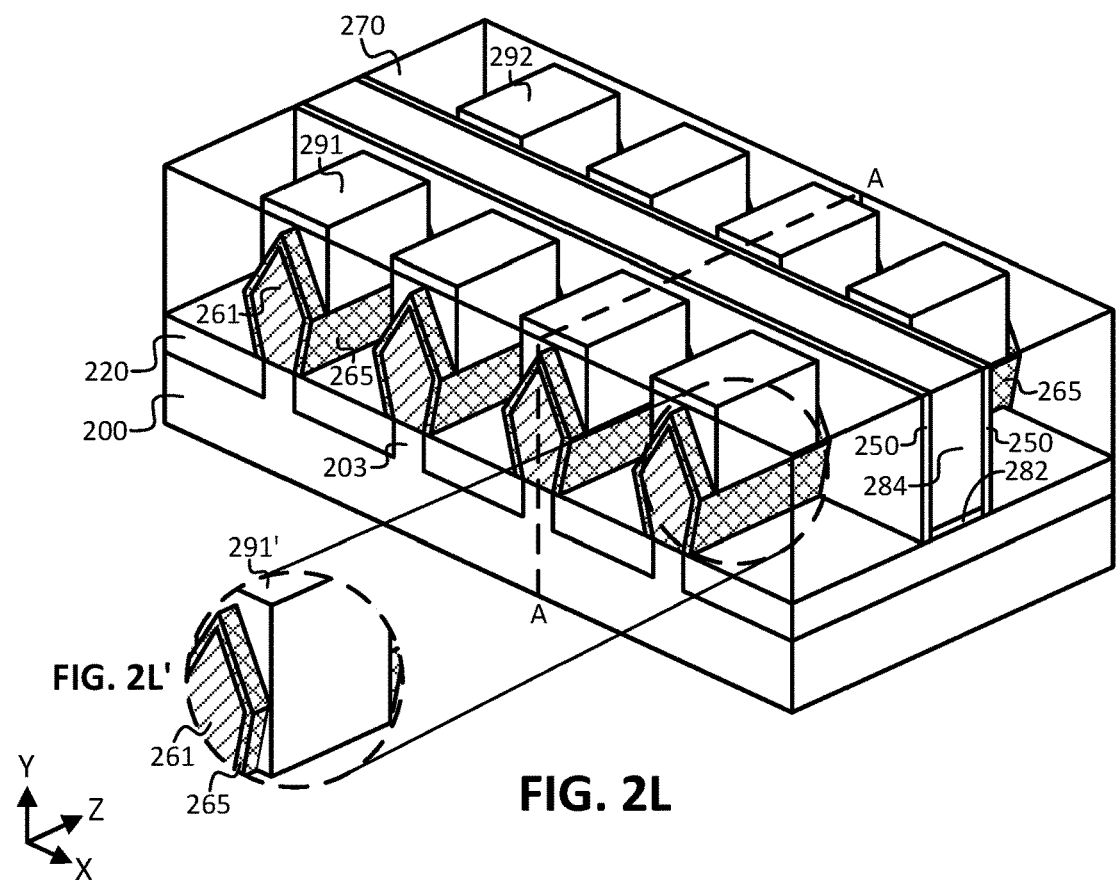

Method 100 of FIG. 1 continues with performing 122 S/D contact processing to form the example resulting structure of FIG. 2L, in accordance with some embodiments. In some embodiments, contact processing 122 first includes forming S/D contact trenches 290 above the S/D regions 261/262, as shown in FIG. 2K. In some such embodiments, the contact trenches 290 may be formed using any suitable techniques, such as performing one or more wet and/or dry etch processes to remove portions of ILD layer 270 as shown, and/or any other suitable processing as will be apparent in light of this disclosure. Such etch processing may be referred to herein as the S/D contact trench etch processing, or simply, contact trench etch processing. Further, in some such embodiments, the ILD may first be patterned such that areas that are not to be removed via the contact trench etch processing are masked off, for example. As shown in the example structure of FIG. 2K, the contact trench etch processing stopped after removing the ILD material 270 from above each S/D region 261/262, which also resulted in the removal of carbon-based ESL 265 from the top surfaces of each S/D region 261/262 as shown. However, in other embodiments, the contact trench processing may remove more or less material. For example, FIG. 2K' is a blown-out portion of FIG. 2K, illustrating a variation that may occur as S/D contact processing 122 of method 100 is performed, in accordance with some embodiments. Specifically, as shown in FIG. 2K', the S/D contact processing resulted in trench 290' that extends down to STI layer 220 and thus consumes all of the carbon-based ESL 265 from around all four sides/surfaces of S/D region 261 to expose all four of those sides/surfaces for making contact. The presence of carbon-based ESL 265 allows for the formation of such a contact trench 290', because without the ESL 265, a significant portion of S/D region 261 would be consumed when etching down to the bottom of that three-dimensional S/D region. Therefore, employing a carbon-based ESL 265 enables gaining access to increased surface area of a given S/D region for making contact, thereby resulting in decreased resistance at that S/D contact location, leading to an increase in transistor performance, as can be understood based on this disclosure.

As shown in the example structure of FIG. 2K, the carbon-based ESL 265 was completely consumed/removed in the contact trench locations 290 during the contact trench etch processing, resulting in the material of the S/D regions 261/262 being exposed in the contact trench 290 locations. However, in other embodiments, at least a portion of carbon-based ESL 265 may remain in the contact trench locations 290 after contact trench etch processing has been performed, where the remaining portion of the ESL 265 may be kept or removed as desired. For example, FIG. 2K'' is a blown-out portion of FIG. 2K''', illustrating a variation that may occur as S/D contact processing 122 of method 100 is performed, in accordance with some embodiments. Specifically, as shown in FIG. 2K'', the S/D contact processing resulted in trench 290'' where a portion of carbon-based ESL 265 remains on S/D region 262 after the contact etch has been performed. Regardless of whether the carbon-based ESL 265 is completely consumed in the contact trench locations, partially consumed, or not consumed at all, the carbon-based ESL 265 can be used to protect and/or preserve the S/D regions 261/262 during the contact trench etch processing, as can be understood based on this disclosure. Also note that regardless of whether at least a portion of ESL 265 remains in the contact trench 290 locations, it is still present elsewhere on the S/D regions where the contact trenches 290 did not access. For instance, using the example structure of FIG. 2K, the carbon-based ESL 265 remains between the contact trench locations 290 and spacers 250, adjacent the contact trench locations 290 on the S/D regions 261/262 on sides/surfaces opposite the side nearest the adjacent channel region, and also on the lower portion or base of the S/D regions 261/262 below the contact trench locations 290 (as those contact trenches did not extend down to the lower portion or base of the S/D regions). Therefore, regardless of whether carbon from the carbon-based ESL 265 remains between a given S/D region and its contact, the carbon-based ESL 265 will be present elsewhere on the S/D region, as can be understood based on this disclosure.

FIG. 2K''' is a blown-out portion of FIG. 2K, illustrating a variation that may occur as S/D contact processing 122 of method 100 is performed, in accordance with some embodiments. As shown in FIG. 2K''', the portion reproduced is the top of the right-most S/D region 262 that includes contact trench 290'''' formed above that S/D region. The portion is reproduced to illustrate the variation that, in some cases, the contact trench etch processing may consume a portion of the top of the S/D region such as is shown. In this example case, the variation resulted in removing a portion of the top of the S/D region 262, as is shown. Moreover, in general, the shape of S/D regions 261/262 may be affected by the formation of the metal contacts in the contact trenches 290 (or 290' or 290'') and/or by other processing performed after the S/D regions 261/262 have been formed, in accordance with some embodiments. Regardless, in embodiments including {111} faceting on the top surface(s) of the originally formed S/D regions 261/262, the final S/D regions need not include 100% {111} faceting, such that the top surface(s) of one or more of the S/D regions that are formed with {111} faceting may include {111} faceting for only approximately 60, 65, 70, 75, 80, 85, 90, or 95% of the top surface(s) (by contact area) and not 100%, for example. Such example embodiments can be compared to the S/D regions 261/262 of FIG. 2K which all have two top surfaces that include 100% {111} faceting.

Continuing from the example structure of FIG. 2K to the example structure of FIG. 2L, S/D contact processing 122 includes forming S/D contacts 291/292 above respective S/D regions 261/262, in accordance with some embodiments. In the example structure of FIG. 2L, it can be understood that S/D contacts 291/292 are electrically connected to S/D regions 261/262 but need not be in physical contact with those regions 261/262 as the carbon-based ESL 265 (and/or other intervening layers) may be between the S/D contacts 291/292 and their respective S/D regions 261/262, for example. However, in some embodiments, at least a portion of S/D contacts 291/292 may be in physical contact with S/D regions 261/262, regardless of whether any portion of the carbon-based ESL 265 remains on the S/D region after contact trench etch processing (such as based on the formation of a semiconductor/metallic intermix region between each S/D region and its corresponding contact, for example). In some embodiments, S/D contacts 291/292 may be formed using any suitable techniques, such as depositing metal or metal alloy (or other suitable electrically conductive material) in contact trenches 290. In some embodiments, S/D contact 291/292 formation may include silicidation, germanidation, III-V-idation, and/or annealing processes, for example. In some embodiments, S/D contacts 291/292 may include aluminum or tungsten, although any suitable conductive metal or alloy can be used, such as silver, nickel-platinum, or nickel-aluminum, for example. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

FIG. 2L' is a blown-out portion of FIG. 2L, illustrating example contact 291' formed in the example contact trench 290' from FIG. 2K', in accordance with some embodiments. As can be understood based on FIG. 2L', contact 291' is proximate to four sides/surfaces of its corresponding S/D region 261, in the example embodiment. That can be compared to the contacts 291/292 of FIG. 2L, which are proximate to two sides/surfaces of each corresponding S/D region 261/262, as shown. Regardless, in both embodiments, contact 291' or 291/292 is above its corresponding S/D region. In some embodiments, an S/D contact may be proximate to 1, 2, 3, 4, 5, 6, 7, 8, or more sides/surfaces of its corresponding S/D region. Note that an S/D contact being proximate to a side of an S/D region means that it is nearby that side such that it is in electrical contact with that side but need not be in direct physical contact with that side, and thus, that there may (or may not) be one or more intervening layers between the contact and that side (e.g., one or more intermetallic layers, the carbon-based ESL, etc.).

Figure 3:
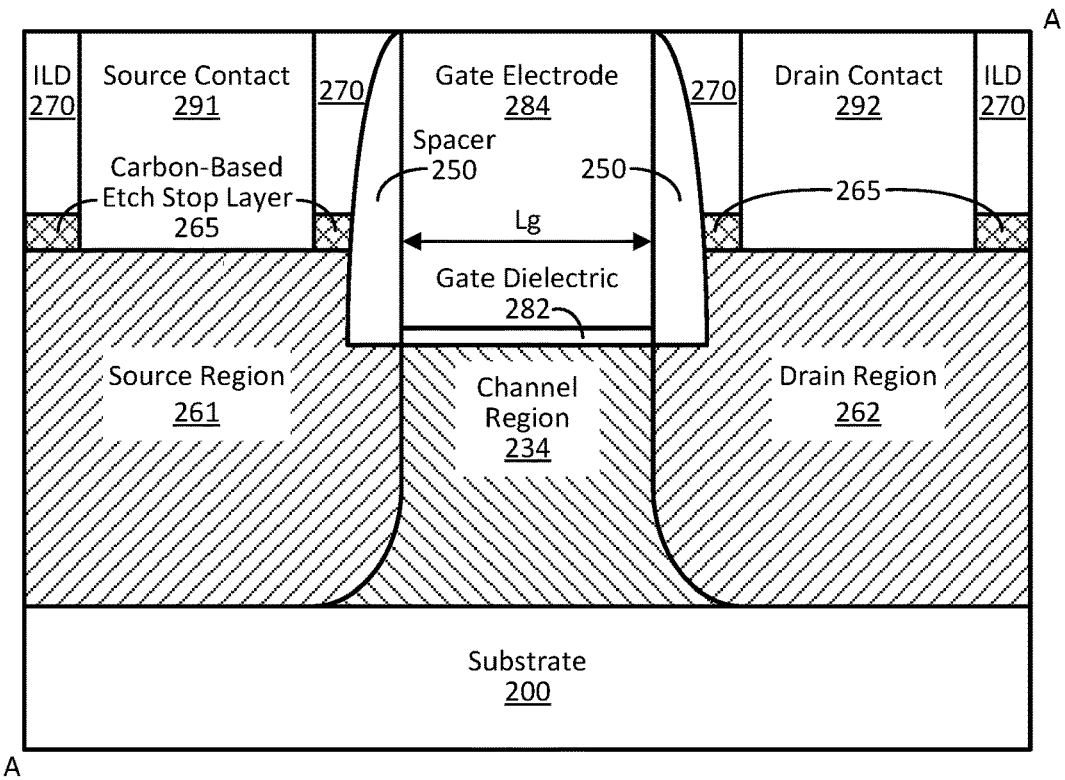
FIG. 3 illustrates an example cross-sectional view along plane A-A in FIG. 2L, in accordance with some embodiments.
Figure 3:
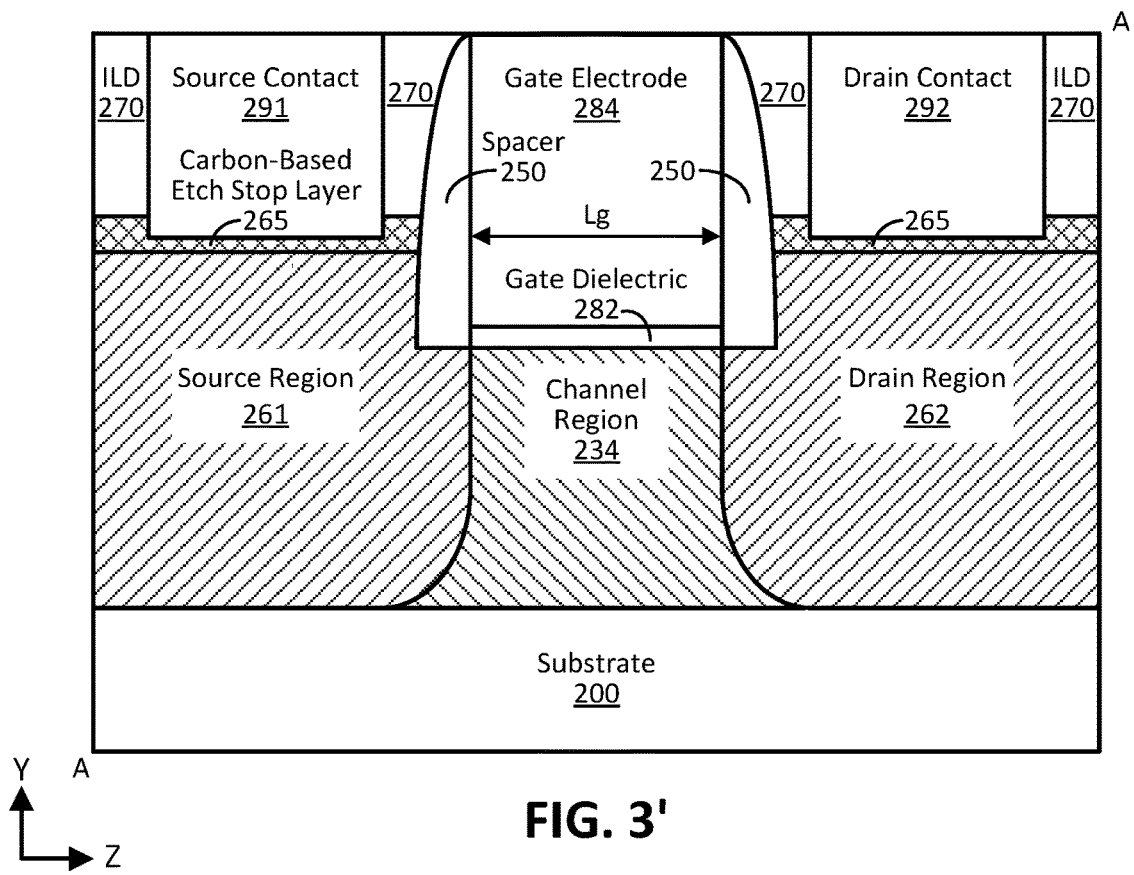

FIG. 3 illustrates an example cross-sectional view along plane A-A in FIG. 2L, in accordance with some embodiments. The cross-sectional view of FIG. 3 is provided to assist in illustrating different features of the structure of FIG. 2L. Therefore, the previous relevant description with respect to each similarly numbered feature is equally applicable to FIG. 3. However, note that the dimensions of the features shown in FIG. 3 may differ relative to the features in FIG. 2L, for ease of illustration. Also note that some variations occur between the structures, such as the shape of spacers 250 and the shape of finned channel region 234, for example. Further note that S/D region 261 is indicated as the source region, with source contact 291 above that source region 261, and that S/D region 262 is indicated as the drain region, with drain contact 292 above that drain region 262. As shown in FIG. 3, the carbon-based ESL 265 is shown directly on the S/D regions 261/262, such that carbon included in the ESL 265 is directly on the S/D regions 261/262. In addition, the carbon-based ESL 265 is present directly on the S/D regions 261/262 in areas not access by contact trenches 290 in which contacts 291/292 were formed, in this example embodiment. For instance, the carbon-based ESL 265 is between the source contact 291 and gate electrode 284 (and also between the source contact 291 and spacer 250) and the carbon-based ESL 265 is also between the drain contact 292 and gate electrode 284 (and also between the drain contact 292 and spacer 250), in this example embodiment; however, the carbon-based ESL need not be located in those locations in other embodiments. Further, in this example embodiment, the carbon-based ESL 265 is located adjacent the contacts 291/292 on sides/surfaces opposite the side closest to the gate electrode 284, as shown; however, the carbon-based ESL need not be located in those locations in other embodiments.

In some embodiments, the length of gate electrode 284 (e.g., the dimension between spacers 250, or between contacts 291 and 292, in the Z-axis direction), which is indicated as Lg, may be any suitable length as will be apparent in light of this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length may be less than a given threshold, such as less than 100, 50, 45, 40, 35, 30, 25, 20, 15, 10, 8, or 5 nm, or less than some other suitable threshold as will be apparent in light of this disclosure. In some embodiments, the techniques enable maintaining a desired device performance when scaling to such low thresholds, such as sub-50, sub-40, sub-30, or sub-20 nm thresholds, as can be understood based on this disclosure. Further, the techniques described herein may allow the gate length and the effective channel length (dimension between the S/D regions in the Z-axis direction) to be the same or approximately the same, in accordance with some embodiments. Thus, the gate length may approximate the effective channel length, in some such embodiments.

FIG. 3' illustrates the cross-sectional view of FIG. 3, including the variation illustrated by FIG. 2K" where a portion of the carbon-based ESL remains on the S/D regions after contact trench etch processing is performed, in accordance with some embodiments. Thus, all previous relevant description with respect to FIG. 3 is equally applicable to FIG. 3', except that the carbon-based ESL 265 is between source region 261 and source contact 291 and the carbon-based ESL 265 is also between drain region 262 and drain contact 292 as shown in the example embodiment of FIG. 3'. Note that although carbon-based ESL 265 is shown as a distinct layer between each S/D region 261/262 and its corresponding contact 291/292, in some embodiments, the carbon-based ESL 265 may not be such a distinct layer, but that a portion of that ESL 265 remained on one or both of the S/D regions 261/262 may be detected by observing carbon (e.g., via electron microscopy, such as SEM, TEM, or STEM) at the interface between the one or both of the S/D regions 261/262 and corresponding contacts 291/292. For instance, in some embodiments, the carbon-based ESL 265 may be integrated into the intermetallic region between a given S/D region and its contact, where the intermetallic region includes a mixture of semiconductor material from the given S/D region, metal from the contact (and/or other layers formed in the contact trench), and carbon from the carbon-based ESL 265. Even where the carbon-based ESL 265 remains (at least in part) in a given S/D contact trench, such that carbon will be located between the given S/D and its contact, the device will still operate in an effective manner. Regardless of whether the carbon-based ESL 265 is present between a given S/D region and its contact, the carbon-based ESL is still present directly on or proximate to the given S/D region in at least some areas outside of the contact trench locations, in accordance with some embodiments, such as is shown in FIGS. 3 and 3'. Therefore, detection of the techniques described herein, including the use of a carbon-based ESL, may be determined in a multitude of ways.

Method 100 of FIG. 1 continues with completing 124 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 102-124 of method 100 is shown in a particular order for ease of description. However, one or more of the processes 102-124 may be performed in a different order or may not be performed at all. For example, box 114 is an optional process that need not be performed in embodiments employing a gate first process flow, for example. Numerous variations on method 100 and the techniques described herein will be apparent in light of this disclosure. For instance, the contact trench etch processing may result in a number of different variations, such as shown in FIGS. 2K', 2K", and 2K''', to provide some examples. Recall that the techniques may be used to form a multitude of different transistor types and configurations. Although the techniques are primarily depicted and described herein in the context of employing a carbon-based ESL for both of the S/D regions of a given transistor, the present disclosure is not intended to be so limited, as the techniques may be used to benefit only one S/D region of a given transistor, and not the other, in some embodiments. Numerous variations and configurations will be apparent in light of the present disclosure.

Example System

Figure 4:
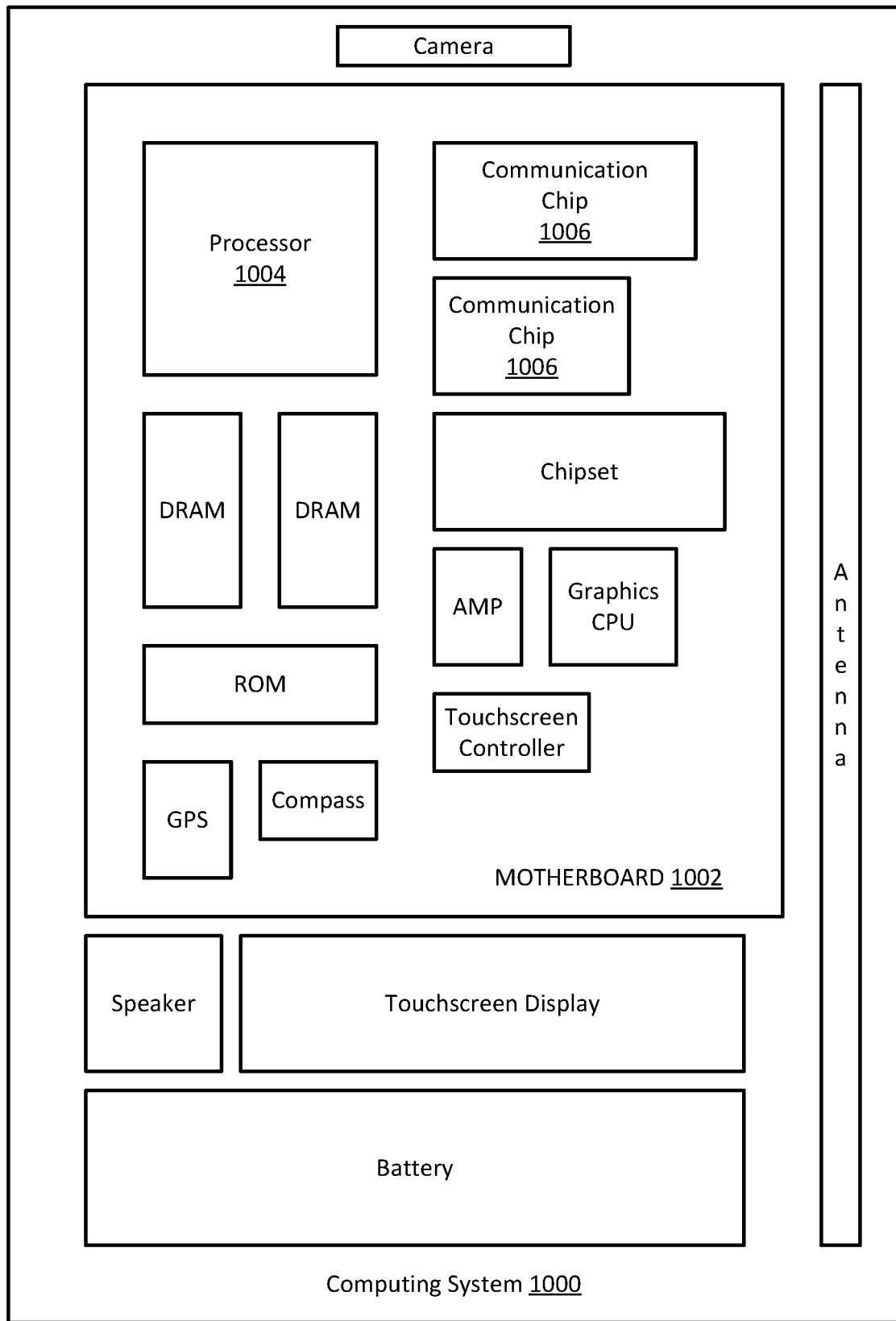
FIG. 4 illustrates a computing system implemented with integrated circuit structures and/or transistor devices formed using the techniques disclosed herein, in accordance with some embodiments of the present disclosure.

FIG. 4 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit (IC) including at least one transistor, the IC including: a channel region; a gate above the channel region; a source region adjacent the channel region; a drain region adjacent the channel region; a first contact above the source region; a second contact above the drain region; and a layer including carbon, the layer directly on at least a portion of each of the source and drain regions.

Example 2 includes the subject matter of Example 1, wherein the carbon included in the layer is between the first contact and the source region and the carbon included in the layer is also between the second contact and the drain region.

Example 3 includes the subject matter of Example 1, wherein the carbon included in the layer is absent between the first contact and the source region and the carbon included in the layer is also absent between the second contact and the drain region.

Example 4 includes the subject matter of any of Examples 1-3, wherein the layer is between the first contact and the gate and the layer is also between the second contact and the gate.

Example 5 includes the subject matter of any of Examples 1-4, wherein the layer includes other semiconductor material alloyed with the carbon.

Example 6 includes the subject matter of any of Examples 1-5, wherein the layer includes semiconductor material included in at least one of the source and drain regions.

Example 7 includes the subject matter of any of Examples 1-6, wherein the layer includes dopant in a concentration of at least 1E18 atoms per cubic centimeter.

Example 8 includes the subject matter of any of Examples 1-7, wherein the layer includes a thickness of at least 8 nanometers and also includes at least 1 percent carbon by atomic percentage.

Example 9 includes the subject matter of any of Examples 1-7, wherein the layer includes a thickness of at most 5 nanometers and also includes at least 20 percent carbon by atomic percentage.

Example 10 includes the subject matter of any of Examples 1-9, wherein the first contact is proximate to at least two surfaces of the source region and the second contact is proximate to at least two surfaces of the drain region.

Example 11 includes the subject matter of any of Examples 1-10, wherein the source and drain regions both include a three-dimensional structure and the layer is directly on a lower portion of each of the three-dimensional structures of the source and drain regions.

Example 12 includes the subject matter of any of Examples 1-11, wherein at least one of the source and drain regions includes germanium in a concentration by atomic percentage of at least 50%.

Example 13 includes the subject matter of any of Examples 1-12, wherein at least one of the source and drain regions includes group III-V semiconductor material.

Example 14 includes the subject matter of any of Examples 1-13, wherein the at least one transistor includes at least one of a finned, tri-gate, double-gate, finned field-effect transistor (FinFET), nanowire, nanoribbon, and gate-all-around (GAA) configuration.

Example 15 includes the subject matter of any of Examples 1-14, wherein the at least one transistor is one of a metal-oxide-semiconductor field-effect transistor (MOSFET), tunnel field-effect transistor (TFET), and fermi-filter field-effect transistor (FFFET).

Example 16 includes the subject matter of any of Examples 1-15, wherein the at least one transistor includes an n-channel or a p-channel configuration.

Example 17 is a computing system including the subject matter of any of Examples 1-16.

Example 18 is an integrated circuit (IC) including at least one transistor, the IC including: a channel region; a gate above the channel region; a gate dielectric between the gate and the channel region; a source region adjacent the channel region; a drain region adjacent the channel region; a first contact proximate at least two surfaces of the source region; a second contact proximate at least two surfaces of the drain region; and a layer including semiconductor material alloyed with carbon, the layer directly proximate to at least a portion of each of the source and drain regions, such that carbon is directly adjacent to at least a portion of each of the source and drain regions.

Example 19 includes the subject matter of Example 18, wherein the carbon included in the layer is between the first contact and the source region and the carbon included in the layer is also between the second contact and the drain region.

Example 20 includes the subject matter of Example 18, wherein the carbon included in the layer is absent between the first contact and the source region and the carbon included in the layer is also absent between the second contact and the drain region.

Example 21 includes the subject matter of any of Examples 18-20, wherein the layer is between the first contact and the gate and the layer is also between the second contact and the gate.

Example 22 includes the subject matter of any of Examples 18-21, wherein the semiconductor material included in the layer is also included in at least one of the source and drain regions.

Example 23 includes the subject matter of any of Examples 18-22, wherein the layer includes dopant in a concentration of at least 1E19 atoms per cubic centimeter.

Example 24 includes the subject matter of any of Examples 18-23, wherein the layer includes a thickness between 8 and 20 nanometers and also includes a carbon concentration by atomic percentage between 1 and 5 percent.

Example 25 includes the subject matter of any of Examples 18-23, wherein the layer includes a thickness between 1 and 5 nanometers and also includes a carbon concentration by atomic percentage between 20 and 50 percent.

Example 26 includes the subject matter of any of Examples 18-25, wherein the first contact is proximate to {111} faceting included in the source region and the second contact is proximate to {111} faceting included in the drain region.

Example 27 includes the subject matter of any of Examples 18-26, wherein the first contact is proximate to at least four surfaces of the source region and the second contact is proximate to at least four surfaces of the drain region.

Example 28 includes the subject matter of any of Examples 18-27, wherein the source and drain regions both include a three-dimensional structure and the layer is directly on a lower portion of each of the three-dimensional structures of the source and drain regions.

Example 29 includes the subject matter of any of Examples 18-28, wherein the channel region includes germanium in a concentration by atomic percentage of at least 50%.

Example 30 includes the subject matter of any of Examples 18-29, wherein the channel region includes group III-V semiconductor material.

Example 31 includes the subject matter of any of Examples 18-30, wherein the at least one transistor includes at least one of a finned, tri-gate, double-gate, finned field-effect transistor (FinFET), nanowire, nanoribbon, and gate-all-around (GAA) configuration.

Example 32 includes the subject matter of any of Examples 18-31, wherein the at least one transistor is one of a metal-oxide-semiconductor field-effect transistor (MOSFET), tunnel field-effect transistor (TFET), and fermi-filter field-effect transistor (FFFET).

Example 33 includes the subject matter of any of Examples 18-32, wherein the at least one transistor includes an n-channel or a p-channel configuration.

Example 34 is a mobile computing system including the subject matter of any of Examples 18-33.

Example 35 is a method of forming an integrated circuit (IC) including at least one transistor, the method including: forming a gate above a channel region; forming a source region adjacent the channel region; forming a drain region adjacent the channel region; forming a layer directly on at least a portion of each of the source and drain regions, the layer including carbon; forming a first contact above the source region; and forming a second contact above the drain region.

Example 36 includes the subject matter of Example 35, further including, prior to forming the first and second contacts, etching insulator material above each of the source and drain regions to remove the insulator material and form contact trenches in which the first and second contacts are formed.

Example 37 includes the subject matter of Example 36, wherein etching the insulator material also removes at least a portion of the layer.

Example 38 includes the subject matter of Example 36 or 37, wherein etching the insulator material also completely removes the layer from the contact trench locations.

Example 39 includes the subject matter of any of Examples 35-38, wherein the layer is formed on at least two surfaces of each of the source and drain regions.

Example 40 includes the subject matter of any of Examples 35-39, wherein the layer is formed on at least four surfaces of each of the source and drain regions.

Example 41 includes the subject matter of any of Examples 35-40, wherein the first contact is also formed adjacent the source region and the second contact is also formed adjacent two surfaces of the drain region.

Example 42 includes the subject matter of any of Examples 35-41, wherein the source and drain regions are both formed in a three-dimensional structure and the layer is formed directly on all exposed surfaces of each three-dimensional structure.

Example 43 includes the subject matter of Example 42, wherein all exposed surfaces of each three-dimensional structure includes at least three exposed surfaces per three-dimensional structure.

Example 44 includes the subject matter of any of Examples 35-43, further including: forming a fin from a substrate; forming insulator material around the fin; one of recessing and removing the fin to form a fin-shaped trench; and forming a replacement fin in the fin-shaped trench, wherein the channel region is included at least in part in the replacement fin.

Example 45 includes the subject matter of any of Examples 35-44, wherein the layer includes other semiconductor material alloyed with the carbon.

Example 46 includes the subject matter of any of Examples 35-45, wherein the layer includes semiconductor material included in at least one of the source and drain regions.

Example 47 includes the subject matter of any of Examples 35-46, wherein at least one of the source and drain regions includes germanium in a concentration by atomic percentage of at least 50%.

Example 48 includes the subject matter of any of Examples 35-47, wherein at least one of the source and drain regions includes group III-V semiconductor material.

Example 49 includes the subject matter of any of Examples 35-48, wherein the at least one transistor includes at least one of a finned, tri-gate, double-gate, finned field-effect transistor (FinFET), nanowire, nanoribbon, and gate-all-around (GAA) configuration.

Example 50 includes the subject matter of any of Examples 35-49, wherein the at least one transistor includes an n-channel or a p-channel configuration.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
   a semiconductor region;
   a gate at least above the semiconductor region;
   a source region adjacent the semiconductor region;
   a drain region adjacent the semiconductor region;
   a first contact above the source region;
   a second contact above the drain region; and
   a layer including carbon alloyed with a semiconductor material, wherein the carbon concentration by atomic percentage is in a range from 1-5%, wherein the layer is directly on at least a portion of each of the source and drain regions, and wherein the layer has a monocrystalline structure.

2. The IC of claim 1, wherein the carbon included in the layer is between the first contact and the source region and the carbon included in the layer is also between the second contact and the drain region.

3. The IC of claim 1, wherein the carbon included in the layer is absent between the first contact and the source region and the carbon included in the layer is also absent between the second contact and the drain region.

4. The IC of claim 1, wherein the layer is between the first contact and the gate and the layer is also between the second contact and the gate.

5. The IC of claim 1, wherein the semiconductor material is also included in at least one of the source and drain regions.

6. The IC of claim 1, wherein the layer includes dopant in a concentration of at least 1E18 atoms per cubic centimeter.

7. The IC of claim 1, wherein the layer includes a thickness of at least 8 nanometers.

8. The IC of claim 1, wherein the layer includes a thickness of at most 5 nanometers.

9. The IC of claim 1, wherein the first contact is proximate to at least two surfaces of the source region and the second contact is proximate to at least two surfaces of the drain region.

10. The IC of claim 1, wherein at least one of the source and drain regions includes germanium in a concentration by atomic percentage of at least 50%.

11. The IC of claim 1, wherein at least one of the source and drain regions includes group III-V semiconductor material.

12. The IC of claim 1, wherein the semiconductor region is part of a fin, and the gate is adjacent top and side walls of the fin.

13. The IC of claim 1, wherein the semiconductor region includes one or more nanowires or nanoribbons, and the gate wraps around the one or more nanowires or nanoribbons.

14. An integrated circuit (IC), comprising:
    a non-planar semiconductor region;
    a gate electrode above the non-planar semiconductor region;
    a gate dielectric between the gate electrode and the non-planar semiconductor region;
    a faceted source region adjacent the non-planar semiconductor region;
    a faceted drain region adjacent the non-planar semiconductor region;
    a first contact proximate at least two surfaces of the source region;
    a second contact proximate at least two surfaces of the drain region; and
    a layer including semiconductor material alloyed with carbon, wherein the carbon concentration by atomic percentage is in a range from 1-5%, wherein the layer is directly proximate to at least a portion of each of the source and drain regions, such that carbon is directly adjacent to at least a portion of each of the source and drain regions, and wherein the layer has a monocrystalline structure.

15. The IC of claim 14, wherein the semiconductor material included in the layer is also included in at least one of the source and drain regions.

16. The IC of claim 14, wherein the first contact is proximate to {111} faceting included in the source region and the second contact is proximate to {111} faceting included in the drain region.

17. The IC of claim 14, wherein the first contact is proximate to at least four surfaces of the source region and the second contact is proximate to at least four surfaces of the drain region.

18. The IC of claim 14, wherein the semiconductor region includes germanium in a concentration by atomic percentage of at least 50%.

19. An integrated circuit (IC) comprising:
a semiconductor region;
a gate at least above the semiconductor region;
a source region adjacent the semiconductor region;
a drain region adjacent the semiconductor region;
a first contact above the source region;
a second contact above the drain region; and
a layer including carbon alloyed with a semiconductor material, wherein the carbon concentration by atomic percentage is in a range from 1-5%, and wherein the layer is directly on at least a portion of each of the source and drain regions, wherein the carbon is monocrystalline carbon and the semiconductor material is monocrystalline semiconductor material.

* * * * *